United States Patent
Wang

(10) Patent No.: US 8,777,380 B2
(45) Date of Patent: *Jul. 15, 2014

(54) LIQUID EJECTING HEAD, LIQUID EJECTING APPARATUS AND PIEZOELECTRIC ELEMENT

(71) Applicant: Seiko Epson Corporation, Tokyo (JP)

(72) Inventor: Xiaoxing Wang, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/665,139

(22) Filed: Oct. 31, 2012

(65) Prior Publication Data

US 2013/0106960 A1 May 2, 2013

(30) Foreign Application Priority Data

Nov. 1, 2011 (JP) ................. 2011-240067

(51) Int. Cl.
*B41J 2/045* (2006.01)

(52) U.S. Cl.
USPC .......................................... 347/68

(58) Field of Classification Search
None
See application file for complete search history.

(56) References Cited

U.S. PATENT DOCUMENTS

| | | | |
|---|---|---|---|
| 6,985,281 B2 | 1/2006 | Wagner et al. | |
| 7,002,697 B2 | 2/2006 | Domash et al. | |
| 7,514,685 B2 | 4/2009 | Yoshida | |
| 2011/0037810 A1* | 2/2011 | Wang | 347/68 |

FOREIGN PATENT DOCUMENTS

| | | |
|---|---|---|
| JP | 62-154680 | 7/1987 |
| JP | 01-312877 | 12/1989 |
| JP | 2001-223404 | 8/2001 |
| JP | 2005-510756 A | 4/2005 |
| JP | 2008-070163 A | 3/2008 |

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head for discharging liquid from nozzle openings is provided. The liquid ejecting head includes a piezoelectric element comprising a piezoelectric film inserted between electrodes with buffer layer on one or two surfaces of the piezoelectric film, wherein the piezoelectric film is made from barium titanate-based composition having a perovskite structure containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount and the buffer layer is formed from a complex oxides with perovskite structure containing bismuth, iron, manganese, barium and titanium.

7 Claims, 19 Drawing Sheets

1.00 μm 1.00 μm

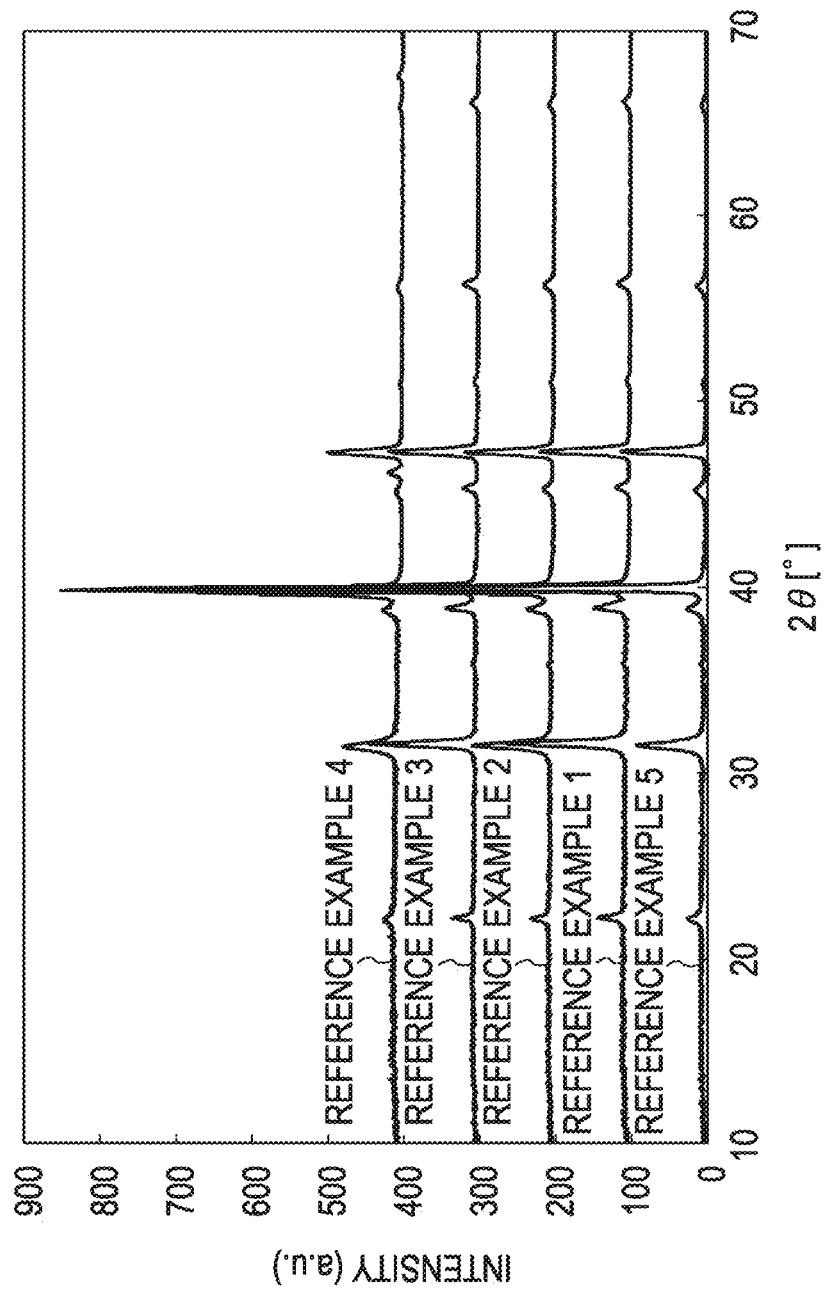

1.00 μm 1.00 μm 1.00 μm

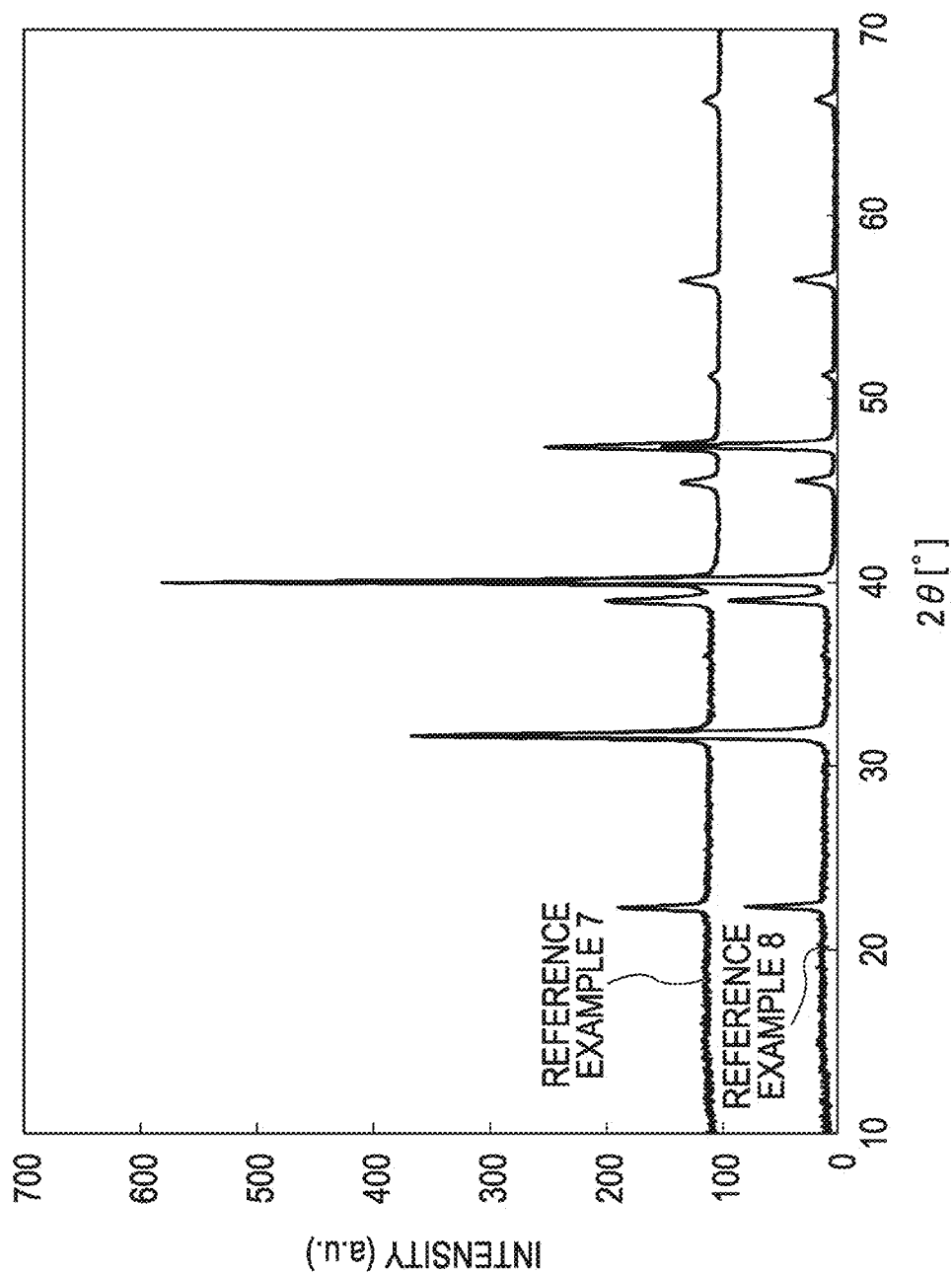

LIQUID EJECTING HEAD, LIQUID EJECTING APPARATUS AND PIEZOELECTRIC ELEMENT

The entire disclosure of Japanese Patent Application No. 2011-240067, filed Nov. 1, 2011, is expressly incorporated by reference herein.

BACKGROUND

1. Technical Field

The present invention relates to a liquid ejecting head that includes a piezoelectric element comprising piezoelectric film formed from a piezoelectric material and electrodes and discharges liquid droplets from a nozzle opening, a liquid ejecting apparatus, and a piezoelectric element.

2. Related Art

As a representative example of a liquid ejecting head, for example, there is an ink jet type recording head in which a part of a pressure generating chamber communicating with nozzles ejecting ink droplets is constituted by a vibration plate, the vibration plate is deformed by a piezoelectric element, and ink in the pressure chamber is pressurized and discharged from nozzles as ink droplets. The piezoelectric element used for the ink jet type recording head, is made from electromechanical a piezoelectric material characterized with conversion, for example, a piezoelectric film inserted between two electrodes.

As methods of forming piezoelectric film, there are chemical solution methods, such as sol-gel, MOD (Motel Organic Deposition) method and so on, and physical method, such as sputtering method. Piezoelectric film can be created using these methods. For example, in case of using sol-gel method, organic metal compounds are dissolved in solvent to form colloidal solution, then it is coated on a substrate, the formed film is heated and crystallized to form a piezoelectric film.

As a piezoelectric material used in the piezoelectric element, generally, for example, a lead-based piezoelectric ceramic represented by lead zirconate titanate (PZT) has been used (for example, see JP-A-2001-223404). However, from the viewpoint of environmental problems, there has been a demand for a piezoelectric material which is lead-free or has a restricted lead content. As a piezoelectric material that does not contain lead, a barium titanate-based complex oxide has been known from the past (see JP-A-62-154680).

However, barium titanate-based composition has been mainly used as a piezoelectric bulk material. There is almost no practical study on barium titanate-based piezoelectric film formed on a substrate by using chemical method or physical method. In addition, barium titanate-based ceramic is fabricated by mixing powder of metal oxides or metal carbonate at first, then calcining, grinding, forming the mixture and firing the formed body at 1000-1400° C., finally making electrode on polished both sides of the ceramic. Therefore, stress caused by volume expansion and contraction of the ceramic at the time of manufacture is significantly small compared with that caused at the time of forming a piezoelectric film on a substrate by chemical solution method or sputtering method.

If the barium titanate-based material is used for a piezoelectric film on a substrate, there is a problem in that displacement is significantly small compared with that of the above-described PZT. It is also desirable to meet the needs of increasing density of barium titanate-based film, firing the film at low temperature and so on.

The present inventor has found a barium titanate-based composition containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount, from which a dense film with large piezoelectric displacement can be formed at low temperature. However, the obtained film with above-mentioned composition shows a relatively high leakage current. In addition, such a problem also occurs to other piezoelectric elements without being limited to a liquid ejecting head represented by an ink jet type recording head.

SUMMARY

The purpose of the invention is to provide a liquid ejecting head including a piezoelectric element that has a low environmental load, suppressed leakage current, large piezoelectric strain, high density and low firing temperature, a liquid ejecting apparatus and the piezoelectric element.

An aspect of the invention is a liquid ejecting head that drives liquid out from nozzle openings. The liquid ejecting head includes a piezoelectric element comprising a piezoelectric film with a buffer layer, and electrodes on both side of the piezoelectric film. The piezoelectric film is made from the barium titanate-based material with a perovskite structure containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount. The buffer layer is formed from a complex oxides with perovskite structure containing bismuth, iron, manganese, barium and titanium.

In the aspect, it is possible to provide a liquid ejecting head including a piezoelectric element having a high strain, high density and low firing temperature by creating a barium titanate-based piezoelectric film containing copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount. Moreover, It is possible to suppress leakage current of the barium titanate-based piezoelectric film by using a buffer layer containing bismuth, iron, manganese, barium and titanium. In addition, since no lead is contained or lead content is suppressed, it is possible to reduce environmental load.

Furthermore, it is preferable that the buffer layer be provided on each of both surfaces of the piezoelectric film. According to the configuration, the leak electric current can be further suppressed.

Furthermore, It is preferable that the piezoelectric film is comprised of columnar crystals. In the configuration, dielectric breakdown of the piezoelectric film can be enhanced even when a high voltage is applied. That is to say, electric strength can be improved.

Another aspect of the invention is a liquid ejecting apparatus including the above liquid ejecting head. According to the aspect, the liquid ejecting apparatus with a piezoelectric film showing low environmental load, suppressed leakage current, large piezoelectric displacement, high density and low firing temperature can be realized.

Yet another aspect of the invention is a piezoelectric element comprising a piezoelectric film with buffer layer on its surface and electrodes on the piezoelectric film, wherein the piezoelectric film is made from barium titanate-based composition with a perovskite structure containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount. The buffer layer is formed from a complex oxides with perovskite structure containing bismuth, iron, manganese, barium and titanium.

In the aspect, it is possible to provide a liquid ejecting head including a piezoelectric element having a high piezoelectric strain, high density and low firing temperature by creating a barium titanate-based piezoelectric film containing copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount. Moreover, it is possible to suppress leakage current of the barium titanate-based piezoelectric film by using a buffer layer comprised of bismuth, iron, manganese, barium and titanium. In addition, since no lead is contained or lead content is suppressed, it is possible to reduce environmental load.

BRIEF DESCRIPTION OF THE DRAWINGS

The invention will be described with reference to the accompanying drawings, wherein like numbers reference like elements.

FIG. 14 is a diagram that illustrates an X-ray diffraction pattern of a reference example.

FIG. 17 is a diagram that illustrates an X-ray direction pattern of a reference example.

DESCRIPTION OF EXEMPLARY EMBODIMENTS

Embodiment 1

Figure 1:
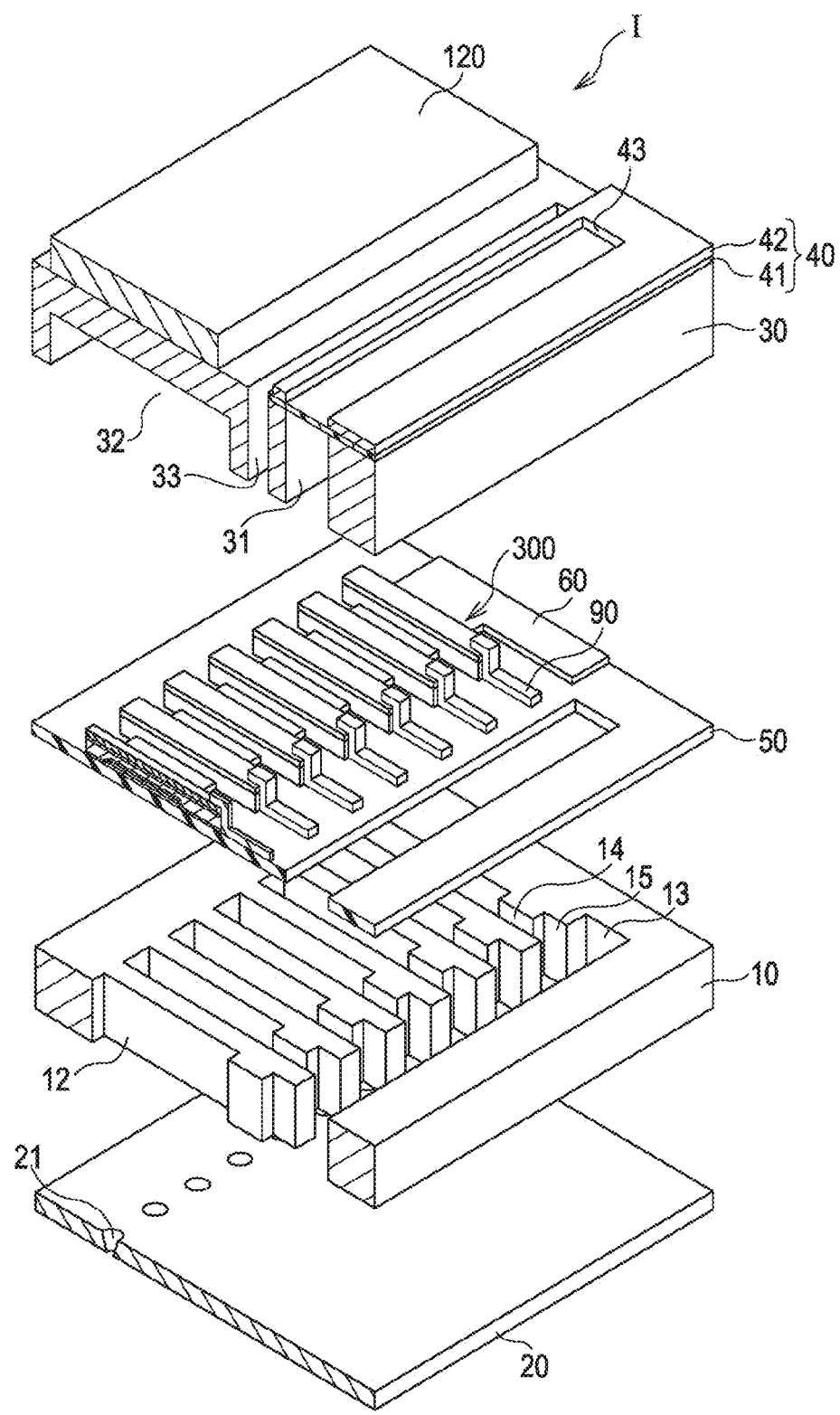
FIG. 1 is an exploded perspective vie that illustrates a schematic configuration of a recording head according to Embodiment 1.
Figure 2:
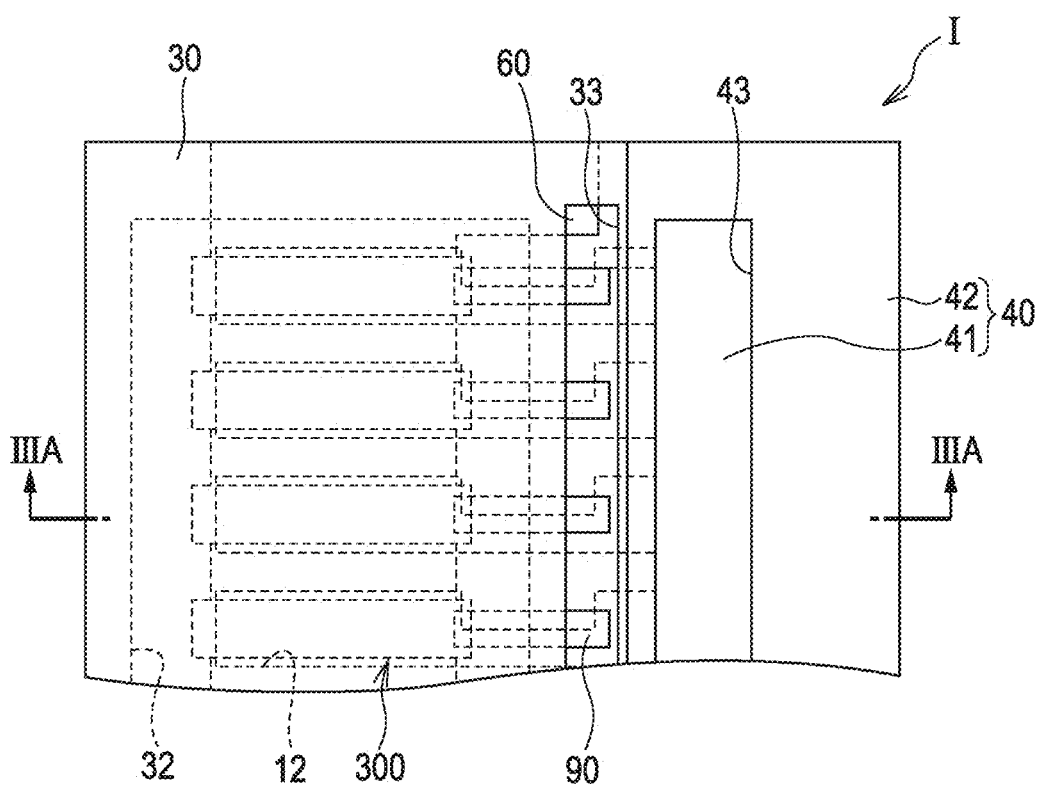
FIG. 2 is a plan view of the recording head according to Embodiment 1.
Figure 3A:
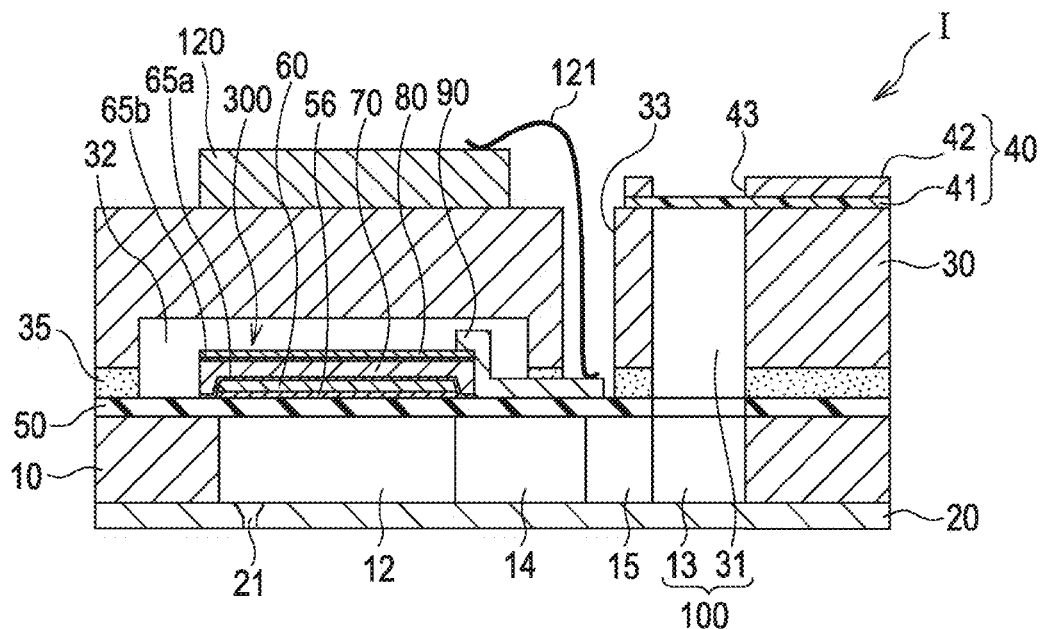
FIGS. 3A and 3B are a cross-sectional view of the recording head according to Embodiment 1 and an enlarged view of major parts thereof.
Figure 3B:
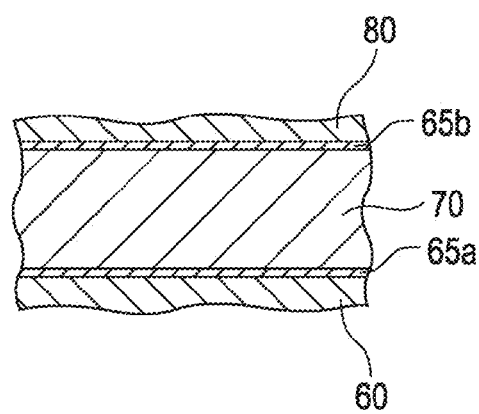

FIG. 1 is an exploded perspective view that illustrates a schematic configuration of an ink jet type recording head which is an example of a liquid ejecting head according to Embodiment 1 of the invention. FIG. 2 is a plan view of FIG. 1. FIG. 3A is a cross-sectional view taken from a line IIIA-IIIA of FIG. 2, and FIG. 3B is an enlarged view of the major parts of FIG. 3A. As shown in FIGS. 1 to 3B, a flow path forming substrate 10 of the present embodiment is formed of a silicon single crystalline substrate, and one surface thereof is formed with an elastic film 50 formed of silicon dioxide.

On the flow path forming substrate 10, a plurality of pressure generating chambers 12 is arranged in a width direction thereof. Furthermore, a communication portion 13 is formed in a region on the outside of the pressure generating chamber 12 of the flow path forming substrate 10 in the longitudinal direction, and the communication portion 13 communicates with each pressure generating chamber 12 via ink supplying paths 14 and communication paths 15 that are provided for every pressure generating chamber 12. The communication portion 13 communicates with a manifold portion 31 of a protective substrate mentioned below, and constitutes a part of the manifold serving an ink chamber common to each pressure generating chamber 12. The ink supplying path 14 is formed to have a width that is narrower than that of the pressure generating chamber 12, and regularly maintains the flow path resistance of ink flowing in the pressure generating chamber 12 from the communication portion 13. In addition, in the present embodiment, although the ink supplying path 14 was formed by squeezing the width of the flow path from one side, the ink supplying path may be formed by squeezing the width of the flow path from both sides. Furthermore, the ink supplying path may be provided by squeezing the flow path from the thickness direction but not squeezing the width of the flow path. Furthermore, in the present embodiment, the flow path forming substrate 10 is formed with a liquid flow path that is constituted by the pressure generating chamber 12, the communication portion 13, the ink supplying path 14, and the communication path 15.

Furthermore, a nozzle plate 20 drilled with a nozzle opening 21 communicating with the vicinity of the end portion of an opposite side of the ink supplying path 14 of each pressure generating chamber 12 is fixed to an opening surface side of the flow path forming substrate 10 using an adhesive, a thermal welding film or the like. In addition, the nozzle plate 20 is formed of, for example, a glass ceramic, a silicon single crystalline substrate, a stainless steel or the like.

Meanwhile, at the opposite side of the opposite side of the opening surface of the flow path forming substrate 10, an elastic film 50 is formed as mentioned above. An adhesion layer 56 is formed on the elastic film 50, and the adhesion film is formed of titanium oxide or the like having a thickness of, for example, about 20 to 50 mm to improve coherency with a foundation of a first electrode 60 such as the elastic film 50. In addition, a insulator film formed of zirconium oxide or the like if necessary may be provided on the elastic film 50.

In addition, on the adhesion layer 56, the first electrode 60, a buffer layer 65a, a piezoelectric film 70 which is a thin film having a thickness of 3 μm or less, preferably 0.5 to 1.5 μm and is formed by a chemical solution method or a sputtering method although the details will be described, a buffer layer 65b, and a second electrode 80 are superimposed and formed, and constitute a piezoelectric element 300 as a pressure generator that causes a pressure change in the pressure generating chamber 12. Herein, the piezoelectric element 300 refers to a portion that includes the first electrode 60, the buffer layer 65a, the piezoelectric film 70, the buffer layer 65b and the second electrode 80. Generally, any one electrode of the piezoelectric element 300 is used as a common electrode, and the other electrode, the buffer layer 65a, the buffer layer 65b, and the piezoelectric film 70 are patterned and constituted for every pressure generating chamber 12. In the present embodiment, although the first electrode 60 is used as the common electrode of the piezoelectric element 300 and the second electrode 80 is as used as an individual electrode of the piezoelectric element 300, the configuration may be reversed on account of a drive circuit and wiring. Furthermore, herein, the piezoelectric element 300 and the vibration plate which is displaced by driving the piezoelectric element 300 are collectively referred to as an actuator. In addition, in the embodiment mentioned above, although the elastic film 50, the adhesion layer 56, the first electrode 60 and the insulator film provided if necessary act as the vibration plate, for example the elastic film 50 and the adhesion layer 56 may be not provided without being limited thereto. Furthermore, the piezoelectric element 300 itself also substantially functions as the vibration plate.

As mentioned above, in the present embodiment, the buffer layer 65a is provided between the piezoelectric film 70 and the first electrode 60 and the buffer layer 65b is provided between the piezoelectric film 70 and the second electrode 80. Although the thicknesses of the buffer layer 65a and the buffer layer 65b are not particularly limited, the thicknesses are preferably significantly thinner than the piezoelectric film 70 in consideration of piezoelectric characteristics (an amount of displacement), and, for example, each are preferably about 20 to 60 mm.

Moreover, the buffer layer 65a and the buffer layer 65b are formed of a complex oxide that has a pervoskite structure containing bismuth (Bi), steel (Fe), manganese (Mn), barium (Ba) and titanium (Ti). In an A site of the perovskite structure, that is, in an $ABO_3$ type structure, has 12-coordination with oxygen, and B site has 6-coordination with oxygen to form an octagon (octahedron). Bi and Ba are situated in the A site, and Fe, Mn and Ti are situated in the B site. In this manner, since the buffer layer 65a and the buffer layer 65b are the complex oxides having a perovskite structure also containing Ti and Ba, and have a constituent element common to barium titante that is a main ingredient of the piezoelectric material constituting the piezoelectric film 70, even if the buffer layer 65a and the buffer layer 65b are provided, the piezoelectric characteristics (the amount of displacement) hardly decrease.

The complex oxide having a perovskite structure containing Bi, Fe, Mn, Ba and Ti is expressed as a mixed crystal of bismuth ferrate manganate and barium titanate or a solid solution in which bismuth ferrate manganate and barium titanate are uniformly dissolved. In addition, in an X-ray diffraction pattern, bismuth ferrate manganate and barium titanate are not detected alone.

Herein, bismuth ferrate manganate and barium titanate are known piezoelectric elements each having a perovskite structure, and various compositions are each known. For example, as bismuth ferrate manganate and barium titanate, in addition to Bi (Fe, Mn) $O_3$ and $BaTiO_3$, although an ingredient is also known in which there is a shortage or surplus of a part of the element, or a part of the element is replaced with other elements, in a case where bismuth ferrate manganate and barium titanate are written in the invention, unless the basic characteristics are not changed, an ingredient which deviates from a stoichiometric composition due to shortage and surplus and an ingredient in which a part of the element is replaced with other elements are also included in the range of bismuth ferrate manganate and barium titanate. Furthermore, unless the basic characteristics are not changed, a ratio of bismuth ferrate manganate and barium titanate can also be variously changed.

The compositions of the buffer layer 65a and the buffer layer 65b formed of the complex oxide having such a perovskite structure are, for example, expressed by a mixed crystal indicated in general formula (1) mentioned below. Furthermore, formula (1) can also be expressed by general formula (1') as mentioned below. Herein, general formula (1) and general formula (1') are composition notations based on stoichiometry, and as mentioned above, unless the perovskite structure can be obtained, an inevitable difference in composition due to lattice mismatch, in addition to oxygen loss or the like, a partial exchanged of the element or the like is also allowed. For example, if a stoichiometric mixture ratio is 1, the range from 0.85 to 1.20 is allowed.

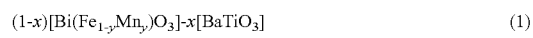

$$(1-x)[Bi(Fe_{1-y}Mn_y)O_3]\text{-}x[BaTiO_3] \qquad (1)$$

$(0<x<0.40, 0.01<y<0.10)$

$$(Bi_{1-x}Ba_x)((Fe_{1-y}Mn_y)_{1-x}Ti_x)O_3 \qquad (1')$$

$(0<x<0.40, 0.01<y<0.10)$

In the present embodiment, although the buffer layer 65a and the buffer layer 65b had the same composition, the layers may have compositions different from each other. Furthermore, in the present embodiment, although the buffer layers were provided on both sides between the piezoelectric film 70 and the first electrode 60 and between the piezoelectric film 70 and the second electrode 80, the buffer layers may be provided on the surface of at least one electrode side, only the buffer layer 65a may be provided or only the buffer layer 65b may be provided.

Furthermore, in the invention, the piezoelectric material forming the piezoelectric film 70 is a barium titanate-based piezoelectric material that is a complex oxide having a perovskite structure containing barium (Ba) and titanium (Ti). As mentioned above, in an A site of the perovskite structure, that is, an $ABO_3$ type structure, has 12-coordination with, and a B site has 6-coordination with to form an octagon (octahedron). Ba is located in the A side and Ti is located in the B side. In addition, in the invention, in a case of being written by barium titanate, unless the basic characteristics are not changed, an ingredient which deviates from a stoichiometric composition ($BaTiO_3$) due to shortage and surplus of the element (Ba, Ti, O) is also included in the range of barium titanate.

Moreover, in the invention, almost the complex oxide forming the piezoelectric film 70 is barium titanate (for example, $BaTiO_3$), and further contains a small quantity of copper (Cu), a small quantity of lithium (Li) and a small quantity of boron (B). The content of Cu is equal to or less than 3 mol % to Ti, preferably, equal to or greater than 0.5 mol % and equal to or less than 3 mol %, the content of Li is equal to or greater than 2 mol % and equal to or less than 5 mol % to Ti and the content of B is equal to or greater than 2 mol % and equal to or less than 5 mol % to Ti. In this manner, almost all is barium titanate, and by containing Cu of 3 mol % or less to Ti, Li of 2 mol % or more and 5 mol % or less to Ti, and B of 2 mol % or more and 5 mol % or less to Ti, compactness and crystal characteristics are improved, and thus the piezoelectric film 70 having a high strain amount is obtained. Furthermore, if the content of Cu is 1 mol % or less to Ti, it is possible to obtain the piezoelectric film 70 in which a heterogenous phase other than the perovskite structure is not detected. Furthermore, although the details will be described later, when manufacturing the piezoelectric film 70 using the chemical solution method and the sputtering method, the piezoelectric film 70 can be fired at a lower temperature and can be crystallized. Thus, it is possible to provide the liquid ejecting head using a member that is easily affected by heat.

In addition, although Cu, Li and B are contained, the piezoelectric film 70 has the perovskite structure. Moreover, it is presumed that Cu, Li and B replaces a part of Ba of the A site and Ti of the B site or are present on an interface of the grain.

Herein, as described in JP-A-62-154680 or the like, although various barium titanate-based piezoelectric materials have been examined as bulk, since the bulk piezoelectric material has very small stress, the material exhibits the behavior different from the piezoelectric material of the thin film that is generally formed using the chemical solution method and the sputtering method. Thus, the bulk piezoelectric material is hard to divert as the piezoelectric material of the thin film.

Furthermore, the piezoelectric film 70 preferably has the columnar crystal. If the layer has the columnar crystal, even if high voltage is applied, the layer is hard to insulatorily breakdown, that is, pressure resistance can be improved, and the grain size of the piezoelectric film 70 becomes uniform.

In this manner, by forming the piezoelectric film 70 of the thin film of the barium titanate-based piezoelectric material containing Cu of 3 mol % or less to Ti, Li of 2 mol % or more and 5 mol % or less to Ti, and B of 2 mol % or more and 5 mol % or less to Ti, and providing at least one of the buffer layer 65a and the buffer layer 65b formed of the complex oxide having a perovskite structure containing Bi, Fe, Mn, Ba and Ti on at least one surface in the thickness direction, as described in the embodiment mentioned below, compared to a case where the buffer layer 65a and the buffer layer 65b are not provided, the leak electric current can be suppressed. Thus, an ink jet type recording head having excellent reliability is provided. Of course, as mentioned above, the piezoelectric film 70 has a high strain amount, is compact, and can be fired at a low temperature.

A lead electrode 90, for example, formed of gold (Au) or the like is connected to the respective second electrodes 80 that are individual electrodes of the piezoelectric element 300, and the lead electrode 90 is drawn from the vicinity of the end portion of the ink supplying path 14 side and is extended onto the elastic film 50 and an insulator film provided if necessary.

On the flow path forming substrate 10 formed with the piezoelectric element 300, that is, on the first electrode 60, the elastic film 50, and the insulator film and the lead electrode 90 provided if necessary, a protective substrate 30 having a manifold portion 31 constituting at least a part of the manifold 100 is bonded via an adhesive 35. In the present embodiment, the manifold portion 31 penetrates the protective substrate 30 in the thickness direction, is formed throughout the width direction of the pressure generating chamber 12, communicates with the communication portion 13 of the flow path forming substrate 10 as mentioned above, and forms the manifold 100 that serves as the common ink chamber of the respective pressure generating chamber 12. Furthermore, the communication portion 13 of the flow path forming substrate 10 may be divided into a plurality of portions for every pressure generating chamber 12, and only the manifold portion 31 may be used as the manifold. In addition, for example, only the pressure generating chamber 12 may be provided in the flow path forming substrate 10, and the ink supplying path 14 communicating with the manifold 100 and the respective pressure generating chambers 12 may be provided in a member (for example, the elastic film 50, an insulator film provided if necessary or the like) that is interposed between the flow path forming substrate 10 and the protective substrate 30.

Furthermore, in a region of the protective substrate 30 opposite to the piezoelectric element 300, a piezoelectric element holding portion 32 having enough space not to disturb the movement of the piezoelectric element 300 is provided. The piezoelectric element holding portion 32 may have enough space not to disturb the movement of the piezoelectric element 300, and the space may be sealed and may not be sealed.

As the protective substrate 30, it is preferable to use a material having substantially the same coefficient of thermal expansion as that of the flow path forming substrate 10, for example, a glass, a ceramic material or the like, and in the present embodiment, the protective substrate 30 is formed using the silicon single crystalline substrate of the same material as the flow path forming substrate 10.

Furthermore, the protective substrate 30 is formed with a through hole 33 that penetrates the protective substrate 30 in the thickness direction. Moreover, the vicinity of the end portion of the lead electrode 90 drawn from the respective piezoelectric elements 300 is provided to be exposed into the through hole 33.

Furthermore, a drive circuit 120 for driving the piezoelectric element 300 arranged in parallel is fixed onto the protective substrate 30. As the drive circuit 120, for example, a circuit board, a semiconductor integrated circuit (IC) or the like. Moreover, the drive circuit 120 and the lead electrode 90 are electrically connected to each other via a connection wiring 121 formed of a conductive wire such as a bonding wire.

Furthermore, a compliance substrate 40 constituted by a sealing film 41 and a fixing plate 42 is bonded onto the protective substrate 30. Herein, the sealing film 41 is formed of a flexible material having low rigidity, and one surface of the manifold portion 31 is sealed by the sealing film 41. Furthermore, the fixing plate 42 is formed of a relatively hard material. Since a region of the fixing plate 42 facing the manifold 100 is an opening portion 43 that is completely removed in the thickness direction, the one surface of the manifold 100 is sealed only by the sealing film 41 having flexibility.

In ink jet type recording head I of the present embodiment, ink is taken from an ink introduction port connected to external ink supplying means (not shown), after the inside from the manifold 100 to the nozzle opening 21 is filled with ink, the voltage is applied between the respective first electrodes 60 and second electrodes 80 corresponding to the pressure generating chamber 12 depending on the recording signal from the drive circuit 120, and the elastic film 50, the adhesion layer 56, the first electrode 60, the buffer layer 65a, the buffer layer 65b, and the piezoelectric film 70 are bent and deformed, whereby the pressure in each pressure generating chambers 12 increases, and the ink droplet is discharged from the nozzle opening 21.

Next, an example of a manufacturing method of the ink jet type recording head of the present embodiment will be described with reference to FIG. 4A to FIG. 8B. In addition FIGS. 4A to 8B are cross-sectional views of the pressure generating chamber in the longitudinal direction.

Figure 4A:
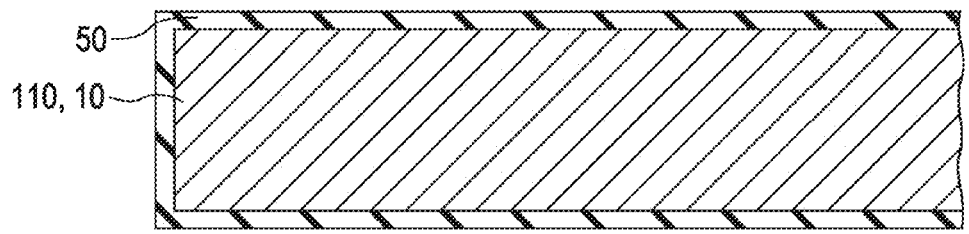
FIGS. 4A and 4B are cross-sectional views that illustrate a manufacturing process of the recording head according to Embodiment 1.
Figure 4B:
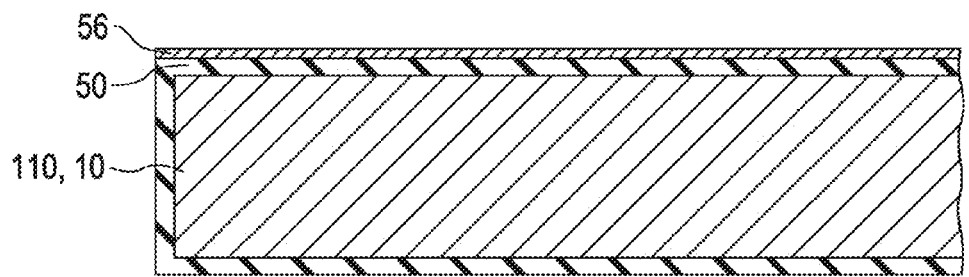

Firstly, as shown in FIG. 4A, a silicon dioxide film formed of silicon dioxide ($SiO_2$) or the like forming the elastic film 50 is formed in the surface of the flow path forming substrate wafer 110 serving as silicon wafer by thermal oxidation or the like. Next, as shown in FIG. 4B, the adhesion layer 56 formed of titanium oxide or the like is formed on the elastic film 50 (the silicon dioxide film) using the sputtering method, the thermal oxidation or the like.

Figure 5A:
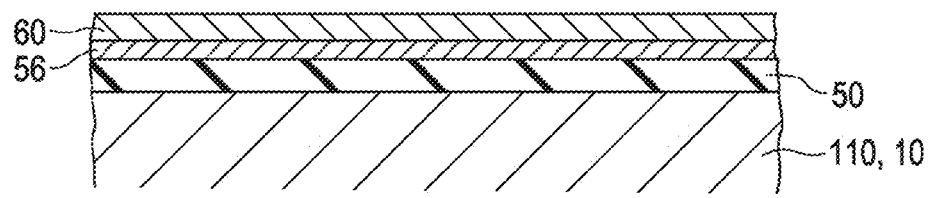
FIGS. 5A to 5C are cross-sectional views that illustrate the manufacturing process of the recording head according to Embodiment 1.
Figure 5B:
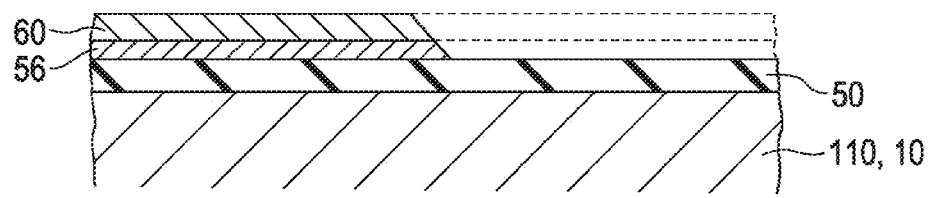

Next, as shown in FIG. 5A, the first electrode 60 formed of platinum, iridium, iridium oxide or such a laminated structure thereof is formed on the adhesion layer 56 over the whole surface using the sputtering method, the deposition method or the like. Next, as shown in FIG. 5B, a resist of a predetermined shape (not shown) is masked on the first electrode 60, and the adhesion layer 56 and the side surface of the first electrode 60 are concurrently patterned so as to be tilted.

Next, after peeling off the resist, the buffer layer 65a is laminated on the first electrode 60. The buffer layer 56a can be manufactured using an MOD (Metal-Organic Decomposition) method of applying and drying the solution including a metal complex, and firing and crystallizing the solution at a high temperature to obtain a buffer layer formed of a metal oxide and a chemical solution method such as a sol-gel method. In addition, it is also possible to manufacture the buffer layer 65a by the sputtering method.

Figure 5C:
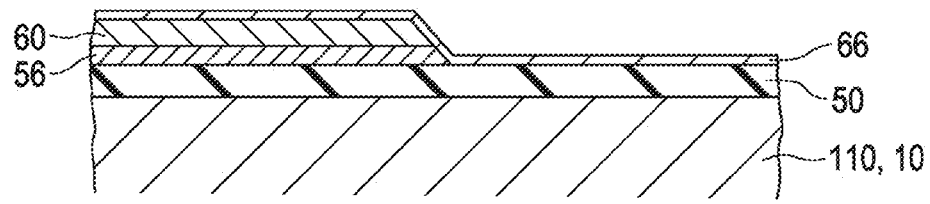

As an example of a specific forming sequence of a case where the buffer layer 65a is formed on the first electrode 60 using the chemical solution method, firstly, as shown in FIG. 5C, the MOD solution, which contains the metal complex containing Bi, Fe, Mn, Ba and Ti at the desired composition ratio, and a buffer layer precursor solution formed of a sol are applied onto the substrate using the spin coating method to form a buffer layer precursor film 66 (a buffer layer application process).

The applied buffer layer precursor solution mixes the metal complex forming the complex oxide containing Bi, Fe, Mn, Ba and Ti by firing and dissolves and distributes the mixture in the organic solvent. The mixing rate of the metal complex each containing Bi, Fe, Mn, Ba and Ti may be mixed so that each metal has a desired mol ratio. As the metal complex each containing Mi, Fe, Mn, Ba and Ti, for example, alkoxide, organic acid salt, β diketone complex or the like can be used. As the metal complex containing Bi, for example, octyl acid bismuth, acetic acid bismuth or the like can be used. As the metal complex containing Fe, for example, octyl acid iron, iron acetate, tris(acetylacetonato) steel or the like can be used. As the metal complex containing Mn, for example, octyl acid manganese, manganese acetate or the like can be used. As the metal complex containing Ba, for example, barium isopropoxide, octyl acid barium, barium acetylacetonato or the like can be used. As the metal complex containing Ti, for example, titanium isopropoxide, octyl acid titanium, titanium (di-i-propoxide)bis(acetylacetonato) or the like can be used. Of course, a metal complex containing two kinds or more of Bi, Fe, Mn, Ba and Ti may be used. Furthermore, as the solvent of the precursor solution, propanol, butanol, pentanol, hexanol, octanol, ethylene glycol, propylene glycol, octane, decane, cyclohexane, xylene, toluene, tetrahydrofuran or the like can be used.

Next, the buffer layer precursor film 66 is heated at a predetermined temperature (for example, 150 to 200° C.) and is dried for a fixed time (a buffer layer drying process). Next, the dried buffer layer precursor film 66 is heated at a predetermined temperature (for example, 350 to 450° C.) and is kept for a fixed time to remove grease (a buffer layer degreasing process). The degreasing mentioned herein disengages the organic components contained in the buffer layer precursor film 66. The atmospheres of the drying process and the degreasing process are not limited but may be air, an oxygen atmosphere, and an inactive gas. In addition, the buffer layer application process, the buffer layer drying process, and the buffer layer degreasing process may be performed several times.

Figure 6A:
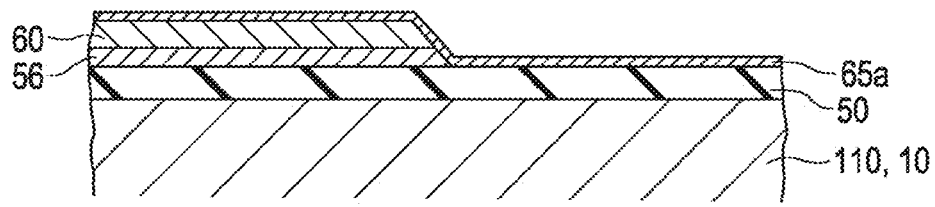
FIGS. 6A to 6D are cross-sectional views that illustrate the manufacturing process of the recording head according to Embodiment 1.

Next, as shown in FIG. 6A, by heating the buffer layer precursor film 66 at a predetermined temperature, for example, about 600 to 850° C., and keeping the buffer layer precursor film 66 for a fixed time, for example, for one minute to 10 minutes, the precursor film 66 is crystallized, thereby forming the buffer layer 65a formed of a complex oxide having a perovskite structure containing Bi, Fe, Mn, Ba and Ti (a buffer layer firing process). In the buffer layer firing process, the atmosphere is not also limited, but may be air, an oxygen atmosphere, and an inactive gas. In addition, in FIG. 6A, although the buffer layer 65a is constituted by one layer, the buffer layer 65a constituted by a plurality of layers by repeating the buffer layer application process, the buffer layer drying process and the buffer layer degreasing process or the buffer layer application process, the buffer layer drying process, the buffer layer degreasing process, and the buffer layer firing process several times depending on a desired film thickness. As a heating device used in the buffer layer drying process, the buffer layer degreasing process, and the buffer layer firing process, for example, a RTA (Rapid Thermal Annealing) device performing the heating by irradiation with an infrared lamp, an electric furnace, a hot plate or the like are adopted.

Next, the piezoelectric film 70 of the thin film is laminated on the buffer layer 65a. The piezoelectric film 70 can be manufactured using an MOD (Metal-Organic Decomposition) method of obtaining the piezoelectric film (the piezoelectric film) formed of a metal oxide by applying and drying the solution containing the metal complex, and firing and crystallizing the solution at a high temperature or a chemical solution method such as a sol-gel method. In addition, the piezoelectric film 70 can be manufactured by the sputtering method or the like.

Figure 6B:
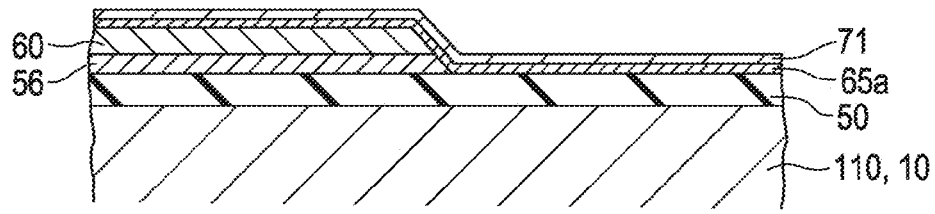

As an example of a specific forming sequence of a case where the piezoelectric film 70 is formed on the buffer layer 65a using the chemical solution method, firstly, as shown in FIG. 6B, the MOD solution, which contains the metal complex containing Ba, Ti, Cu, Li and B at the rate of the desired composition ratio, and, specifically, at the rate of being formed with a complex oxide in which almost all is barium titantate and which contains Cu of 3 mol % or less to Ti, Li of 2 mol % or more 5 mol % or less to Ti, and B of 2 mol % or more and 5 mol % or less to Ti, and a piezoelectric body film precursor solution (hereinafter, also referred to as a "precursor solution") formed of a sol are applied onto the substrate using the spin coating method to form a piezoelectric body precursor film 71 (an application process).

The applied buffer layer precursor solution mixes the metal complex forming the complex oxide containing Ba, Ti, Cu, Li and B by firing and dissolves and distributes the mixture in the organic solvent. The mixing rate of the metal complex each containing Ba, Ti, Cu, Li and B may be mixed so that each metal has a desired mol ratio. As the metal complex each containing Ba, Ti, Cu, Li and B, for example, alkoxide, organic acid salt, β diketone complex or the like can be used. As the metal complex containing Ba, for example, 2-ethyl hexanoic acid barium, barium isopropoxide, barium acetylacetonato can be used. As the metal complex containing Ti, for example, 2-ethyl hexanoic acid titanium, titanium isopropoxide, titanium (di-i-propoxide)bis(acetylacetonato) or the like can be used. As the metal complex containing Cu, for example, 2-ethyl hexanoic acid copper or the like can be used. As the metal complex containing Li, for example, 2-ethyl hexanoic acid lithium or the like can be used. As the metal complex containing B, for example, 2-ethyl hexanoic acid boron or the like can be used. Of course, a metal complex containing two kinds or more of Ba, Ti, Cu, Li and B may be used. Furthermore, as the solvent of the precursor solution, propanol, butanol, pentanol, hexanol, octanol, ethylene glycol, propylene glycol, octane, decane, cyclohexane, xylene, toluene, tetrahydrofuran or the like can be used.

Next, the piezoelectric body precursor film 71 is heated at a predetermined temperature (for example, 150 to 200° C.) and is dried for a fixed time (a drying process). Next, the dried piezoelectric body precursor film 71 is heated at a predetermined temperature (for example, 350 to 450° C.) and is kept for a fixed time to remove grease (a degreasing process). The degreasing mentioned herein disengages the organic components contained in the piezoelectric body precursor film 71. The atmospheres of the drying process and the degreasing process are not limited but may be air, an oxygen atmosphere, and an inactive gas.

Figure 6C:
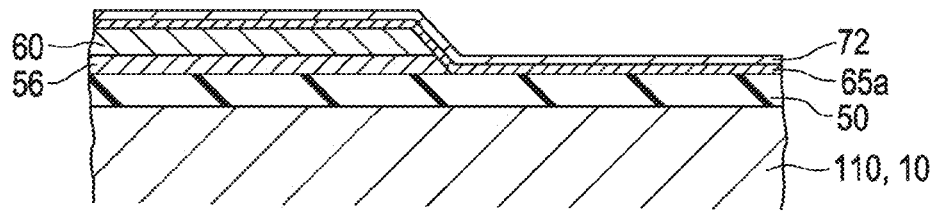

Next, as shown in FIG. 6C, by heating the piezoelectric body precursor film 71 at a predetermined temperature, for example, about 700 to 900° C., and keeping the piezoelectric body precursor film 71 for a fixed time, for example, for one minute to 10 minutes, the piezoelectric body precursor film 71 is crystallized, thereby forming the piezoelectric body film 72 from a complex oxide that is a barium titanate-based complex oxide and the perovskite structure containing Ba, Ti, Cu of 3 mol % or less to Ti, Li of 2 mol % or more and 5 mol % or less to Ti, and B of 2 mol % or more and 5 mol % or less to Ti (a firing process). The firing process is preferably performed in an oxygen atmosphere. As a heating device used in the drying process, the degreasing process and the firing process, for example, an RTA (Rapid Thermal Annealing) device performing the heating by the irradiation of an infrared lamp, an electric furnace, a hot plate or the like are adopted.

Figure 6D:
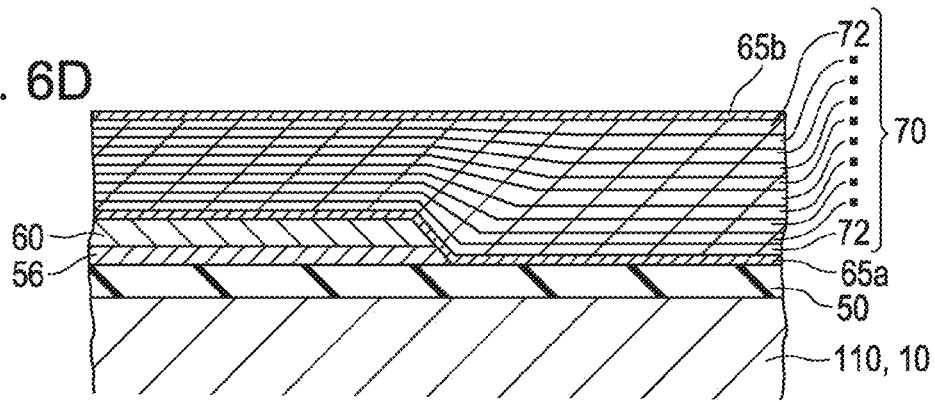

Next, by repeating the application process, the drying process and the degreasing process mentioned above or a series of the application process, the drying process, the degreasing process and the firing process several times depending on a desired film thickness to form the piezoelectric film 70 constituted by the plurality of piezoelectric body films 72, the piezoelectric film 70 with a predetermined thickness constituted by the plurality of piezoelectric body films 72 shown in FIG. 6D is formed. For example, in a case where the thickness of an applied solution film is about 0.1 μm, the film thickness of the entire piezoelectric film 70 constituted by the piezoelectric body film 72 of 10 layers is about 1.1 μm. In the present embodiment, although the piezoelectric body film 72 was provided by being laminated, only one layer may be adopted.

In addition, since the barium titanate-based complex oxide containing a predetermined amount of Cu, Li and B is formed using a raw material containing Ba, Ti, Cu, Li and B, the crystallization can be performed at a low temperature, and a compact crystal can be obtained. Thus, the temperature in the firing process (the firing temperature) can be set to a low temperature. Of course, firing may be performed at a high temperature if there are no impediments to other members.

Furthermore, the piezoelectric body film 72 is formed and laminated by a method of performing a firing process via a new application process in the meantime after forming the piezoelectric body precursor film 71, that is, the piezoelectric body film 72 is laminated to form the piezoelectric film 70 using a method of performing a series of processes of the application process, the drying process, the degreasing process, and the firing process for each layer. Thus, it is possible to form the piezoelectric film 70 of the columnar crystal rather than the granular crystal.

Next, the buffer layer 65*b* is formed on the piezoelectric film 70 by the same method as the method of providing the buffer layer 65*a*, using the buffer layer precursor solution for forming the buffer layer 65*b*. In the present embodiment, although the buffer layer 65*a* and the buffer layer 65*b* have the same composition by forming the buffer layer 65*a* and the buffer layer 65*b* using the buffer layer precursor solution of the same composition, of course, the buffer layer precursor solution of another composition may be used.

Figure 7A:
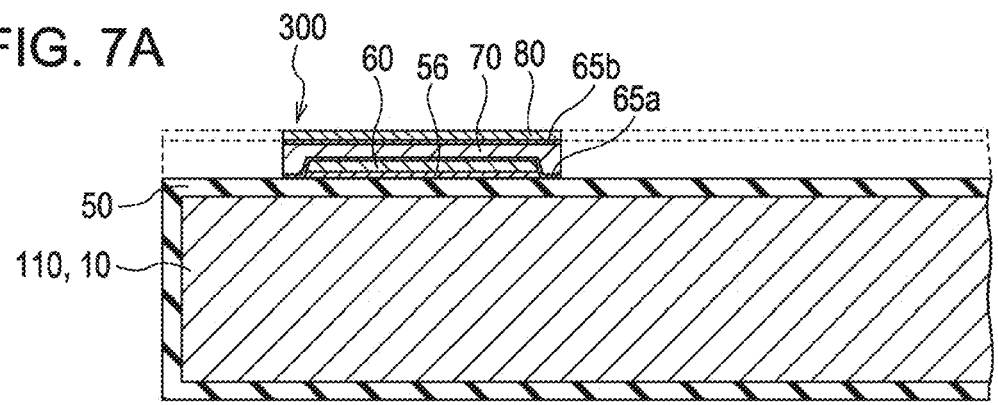
FIGS. 7A to 7C are cross-sectional views that illustrate the manufacturing process of the recording head according to Embodiment 1.

After forming the buffer layer 65*b* in this manner, as shown in FIG. 7A, a second electrode 80 formed of platinum or the like is formed on the buffer layer 65*b* by the sputtering method or the like, the buffer layer 65*a*, the piezoelectric film 70, the buffer layer 65*b* and the second electrode 80 are concurrently patterned in a region opposite to the respective pressure generating chambers 12, and a piezoelectric element 300 is formed that is constituted by the first electrode 60, the buffer layer 65*a*, the piezoelectric film 70, the buffer layer 65*b* and the second electrode 80. In addition, the patterning of the buffer layer 65*a*, the piezoelectric film 70, the buffer layer 65*a* and the second electrode 80 can be performed in a lump by performing the dry etching via a resist (not shown) formed in a predetermined shape. After that, if necessary, for example, the annealing may be formed at a temperature range of 600 to 750° C. As a result, it is possible to satisfactorily form an interface between the piezoelectric film 70 and the buffer layer 65*a* or the buffer layer 65*b*, an interface between the first electrode 60 and the buffer layer 65*a*, and an interface between the second electrode 80 and the buffer layer 65*b*, and thus, crystal characteristics of the piezoelectric film 70 and the buffer layers 65*a* and 65*b*.

Figure 7B:
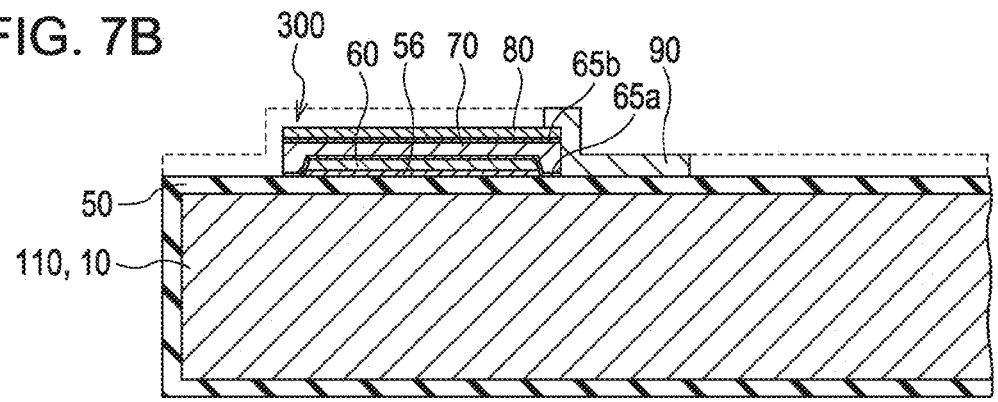

Next, as shown in FIG. 7B, after forming the lead electrode 90 formed of, for example, gold (Au) or the like throughout the entire surface of the flow path forming substrate wafer 110, for example, each piezoelectric element 300 is patterned via a mask pattern (not shown) formed of a resist or the like.

Figure 7C:
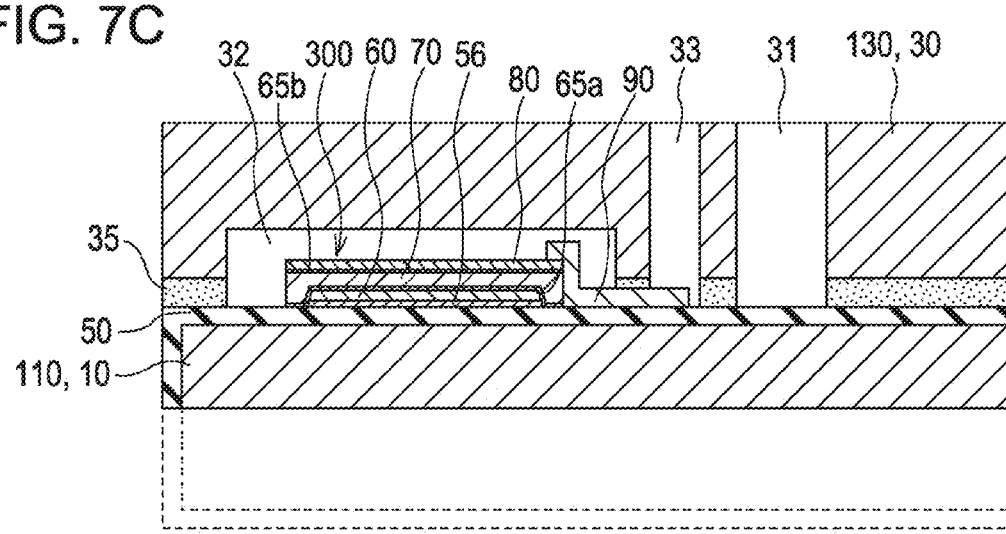

Next, as shown in FIG. 7C, a protective substrate wafer 130 which is a silicon wafer and serves as a plurality of protective substrates 30, is bonded to the piezoelectric element 300 side of the flow path forming substrate wafer 110 via the adhesive 35, and then, the flow path forming substrate wafer 110 is thinned to a predetermined thickness.

Figure 8A:
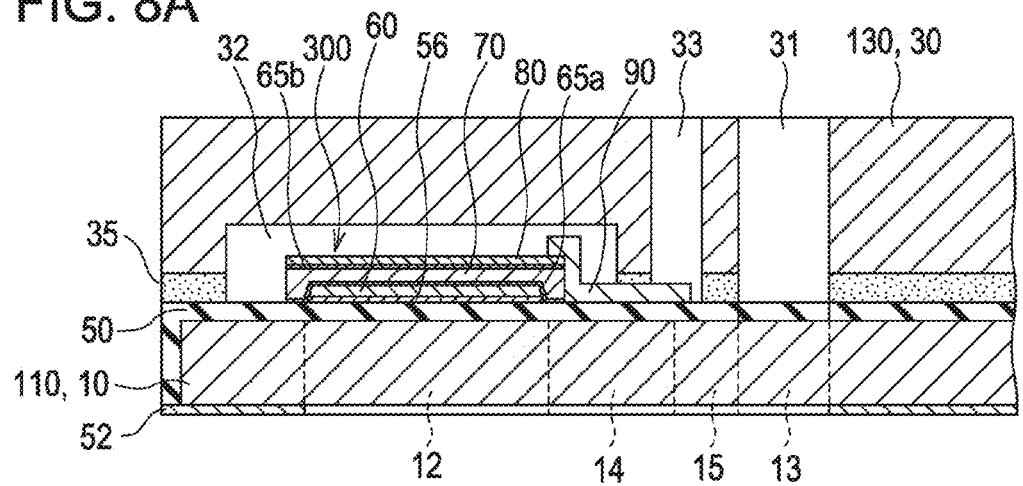
FIGS. 8A and 8B are cross-sectional views that illustrate the manufacturing process of the recording head according to Embodiment 1.

Next, as shown in FIG. 8A, a mask film 52 is newly formed on the flow path forming substrate wafer 110 and is pattered to a predetermined shape.

Figure 8B:
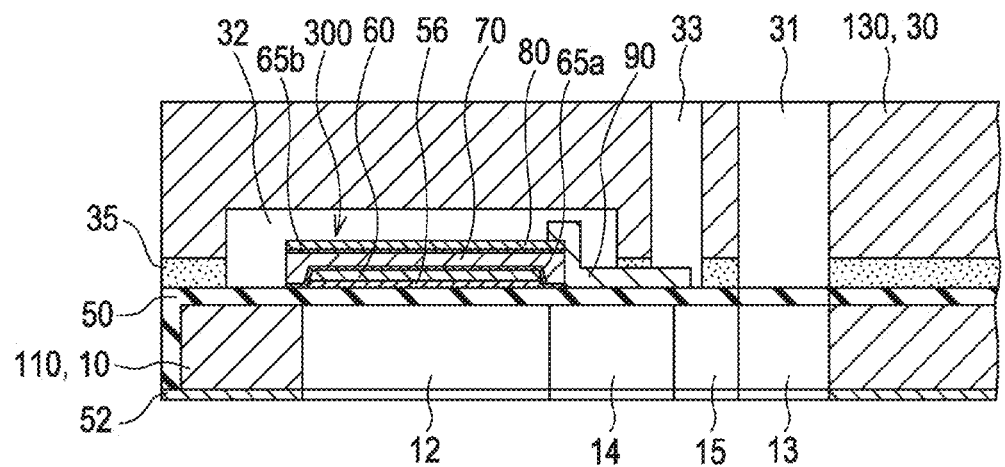

Moreover, as shown in FIG. 8B, by performing the anisotropic etching (the wet etching) of the flow path forming substrate wafer 110 using an alkali solution such as a KOH via the mask film 52, the pressure generating chamber 12, the communication portion 13, the ink supplying path 14, the communication path 15 and the like corresponding to the piezoelectric element 300 are formed.

Next, unnecessary portions of the outer peripheral portions of the flow path forming substrate wafer 110 and the protective substrate wafer 130 are removed, for example, by being cut using dicing or the like. Moreover, after removing the mask film 52 of the surface of the side of the flow path forming substrate wafer 110 opposite to the protective substrate wafer 130, the nozzle plate 20 drilled with the nozzle opening 21 is joined, the compliance substrate 40 is joined to the protective substrate wafer 130, and the flow path forming substrate wafer 110 or the like is divided by the flow path forming substrate 10 or the like of a chip size shown in FIG. 1, thereby forming the ink jet type recording head I of the present embodiment.

Embodiment

Herein, the embodiment is shown and the invention will be more specifically described. In addition, the invention is not limited to the embodiment mentioned below.

Embodiment 1

Firstly, the (100) silicon oxide ($SiO_2$) film was formed on the surface of the single crystal silicon (Si) substrate by the thermal oxidation. Next, titanium oxide with a thickness of 40 nm was laminated on the $SiO_2$ film, and a platinum film (the first electrode 60) with a thickness of 100 nm was formed to face the (111) surface by the sputtering method.

Next, the buffer layer 65a was formed on the first electrode 60 by the spin coating method. The method is as below. Firstly, each n-oxtane solution of 2-ethyl hexanoic acid bismuth, 2-ethyl hexanoic acid iron, 2-ethyl hexanoic acid manganese, 2-ethyl hexanoic acid barium and 2-ethyl hexanoic acid titanium was mixed at a predetermined ratio to prepare the buffer layer precursor solution. Moreover, the buffer layer precursor solution dropped on the substrate formed with the titanium oxide film and the platinum film, the substrate was rotated at 2500 rpm, and the buffer layer precursor film was formed (a buffer layer application process). Next, the buffer layer precursor film was dried at 180° C. for two minutes (a buffer layer drying process). Next, the degreasing was performed at 400° C. for two minutes (a buffer layer degreasing process). Next, by performing the firing in the oxygen atmosphere at 650° C. for five minutes by a RTA (Rapid Thermal Annealing) device, the buffer layer 65a was formed (a buffer layer firing process).

Next, the piezoelectric film 70 was formed on the buffer layer 65a by the spin coating method. The method is as below. Firstly, each n-oxtane solution of 2-ethyl hexanoic acid barium, 2-ethyl hexanoic acid titanium, 2-ethyl hexanoic acid copper, 2-ethyl hexanoic acid lithium and 2-ethyl hexanoic acid boron was mixed by a predetermined ratio to prepare the precursor solution.

Moreover, the precursor solution dropped on the buffer layer 65a, the substrate was rotated at 1500 rpm, and the piezoelectric body precursor film was formed (an application process). Next, the film was dried at 150° C. for one minute (a drying process). Next, the degreasing was performed at 350° C. for three minutes (a degreasing process). Next, the firing was performed in an oxygen atmosphere at 800° C. for five minutes by a RTA device (a firing process). Next, a series of operations including the application process, the drying process, the degreasing process, and the firing process were repeated 12 times, and the piezoelectric film 70 was manufactured by the total of 12 films application processes.

Next, the buffer layer precursor solution having the same composition as that used when forming the buffer layer 65a dropped on the piezoelectric film 70, the substrate was rotated at 2500 rpm, and the buffer layer precursor film was manufactured (a buffer layer application process). Next, the film was dried at 180° C. for two minutes (a buffer layer drying process). Next, the degreasing was performed at 400° C. for two minutes (a buffer layer degreasing process). Next, by performing the firing at 650° C. for five minutes in the oxygen atmosphere using the RTA device, the buffer layer 65b was formed (a buffer layer firing process).

After that, a platinum film (the second electrode 80) of the thickness of 100 nm was formed as the second electrode 80 on the buffer layer 65b using the DC sputtering method, a piezoelectric material which is a barium titanate-based material, contains Ba and Ti of 1:1 (the mol ratio) and contains Cu of 1 mol % to Ti, Li of 3 mol % to Ti, and B of 3 mol % to Ti, specifically, the piezoelectric film 70 of the thickness of 1100 nm having a perovskite structure in $BaTiO_3$:Cu:Li:B=1:0.01:0.03:0.03 (the mol ratio), and the piezoelectric element 300 having the buffer layer 65a with a thickness of about 40 nm and the buffer layer 65b with a thickness of about 40 nm which is formed with the complex oxide having the perovskite structure of the composition ratio of 0.75 $Bi(Fe_{0.95}Mn_{0.05})O_3$-0.25 $BaTiO_3$ on both sides of the piezoelectric film 70 in the thickness direction were formed.

Comparative Example 1

The same operation as Embodiment 1 was performed except that the buffer layer 65a and the buffer layer 65b are not provided.

Test Example 1

Figure 9A:
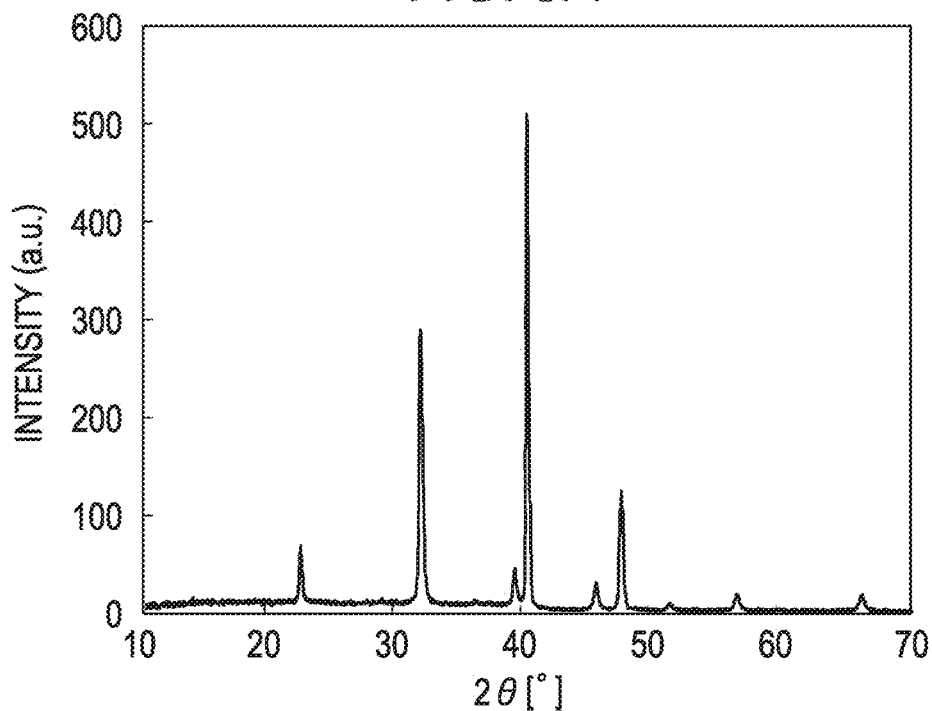
FIGS. 9A and 9B are cross-sectional views that illustrate an X-ray diffraction pattern of an embodiment and a comparative example.
Figure 9B:
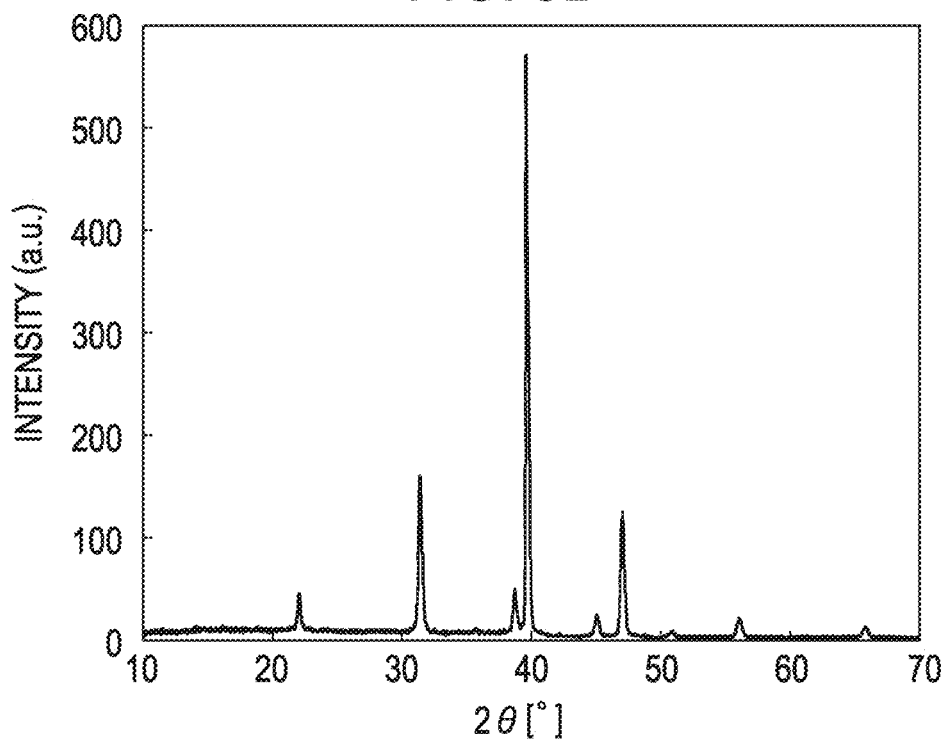

In regard to each piezoelectric element of Embodiment 1 and Comparative Example 1, CuKα ray was used in an X-ray source using a "D8 Discover" made by Bruker AXS GmbH., and the X-ray diffraction pattern of the piezoelectric film 70 was obtained at room temperature (25° C.). The result of Comparative Example is shown in FIG. 9A, and the result of Embodiment 1 is shown in FIG. 9B. As a result, both of Embodiment 1 and Comparative Example 1, a peak due to the perovskite structure and a peak derived from the substrate were observed, but a peak derived from the heterogenous phase which is not the perovskite structure was not observed. Furthermore, the peak intensity derived from the (110) surface of the perovskite structure of Embodiment 1 was stronger than that of Comparative Example 1.

Test Example 2

Figure 10:
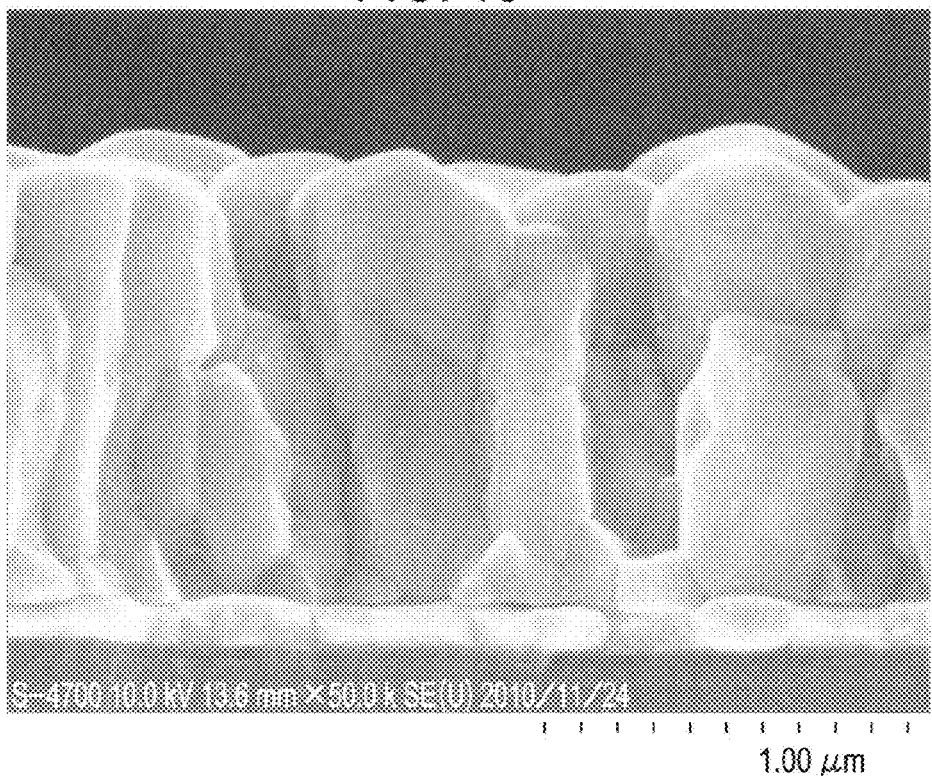
FIG. 10 is a photograph that observes a cross-section of a piezoelectric film of a comparative example.
Figure 11:
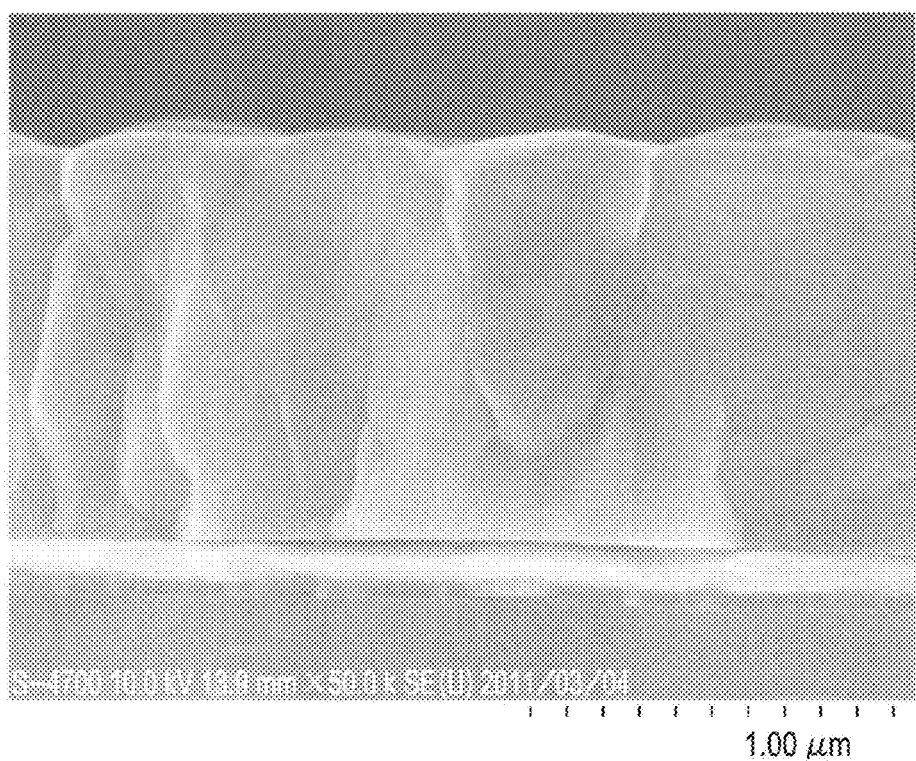
FIG. 11 is a photograph that observes a cross-section of a piezoelectric film of an embodiment.

In Embodiment 1 and Comparative Example 1, in regard to the piezoelectric film 70 in a state where the second electrode 80 not being formed, the cross-section just after forming was observed by a 50,000 times scanning electron microscope (SEM). The result of Comparative Example 1 is shown in FIG. 10, and the result of Embodiment 1 is shown in FIG. 11. As a result, as shown in FIGS. 10 and 11, in Embodiment 1 and Comparative Example 1, the columnar crystal was formed and the crystal particle size was also uniform.

Test Example 3

Figure 12A:
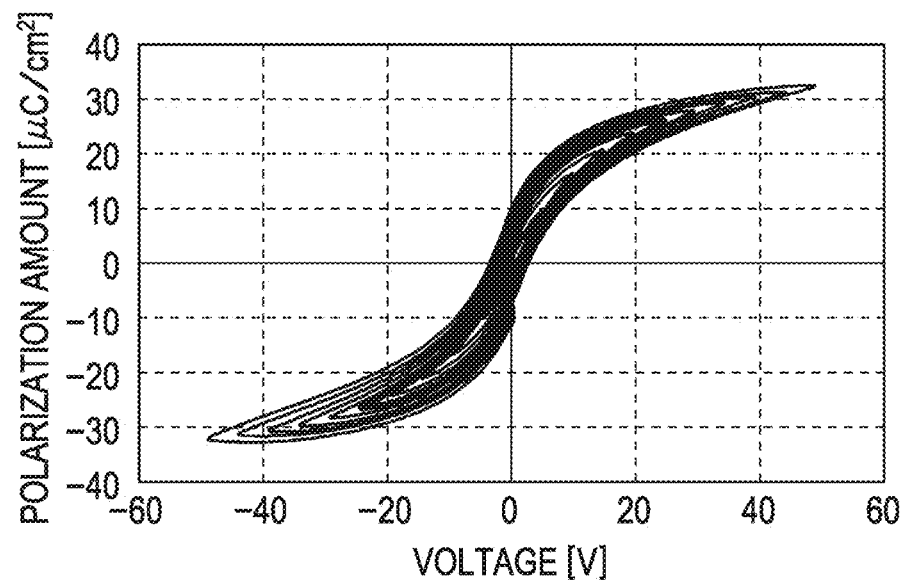
FIGS. 12A and 12B are diagrams that illustrate a P-V curve of the embodiment and the comparative example.
Figure 12B:
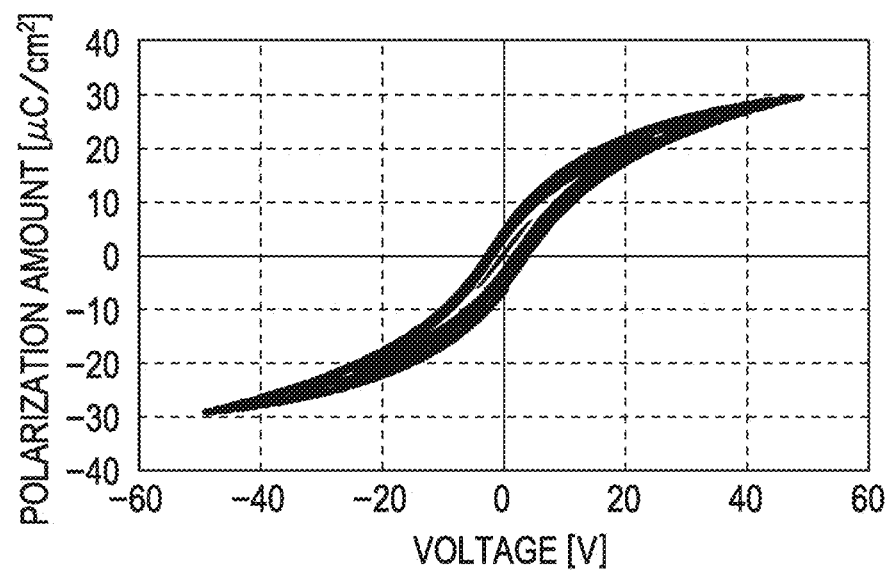

In regard to each piezoelectric element of Embodiment 1 and Comparative Example 1, chopping waves with a frequency of 1 kHz were applied at room temperature using the electrode pattern of ϕ=500 μm by an "FCE-1A" made by TOYO Corp., and a relationship of P (polarization quantity)-V (voltage) was obtained. The result of Comparative Example 1 is shown in FIG. 12A, and the result of Embodiment 1 is shown in FIG. 12B. As a result, it was found that the Embodiment 1 having the buffer layer is a hysteresis curve that has an end portion narrower than Comparative Example 1 not having the buffer layer, and Embodiment 1 has a leak electric current that is lower than that of Comparative Example 1.

Test Example 4

Figure 13A:
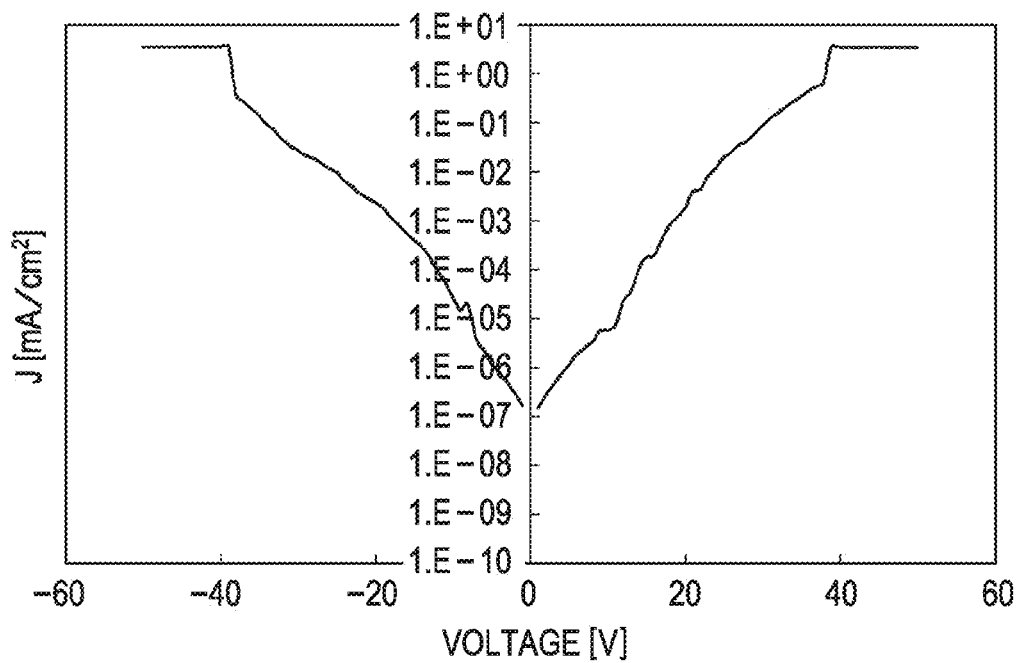
FIGS. 13A and 13B are diagrams that illustrate an I-V curve of the embodiment and the comparative example.
Figure 13B:
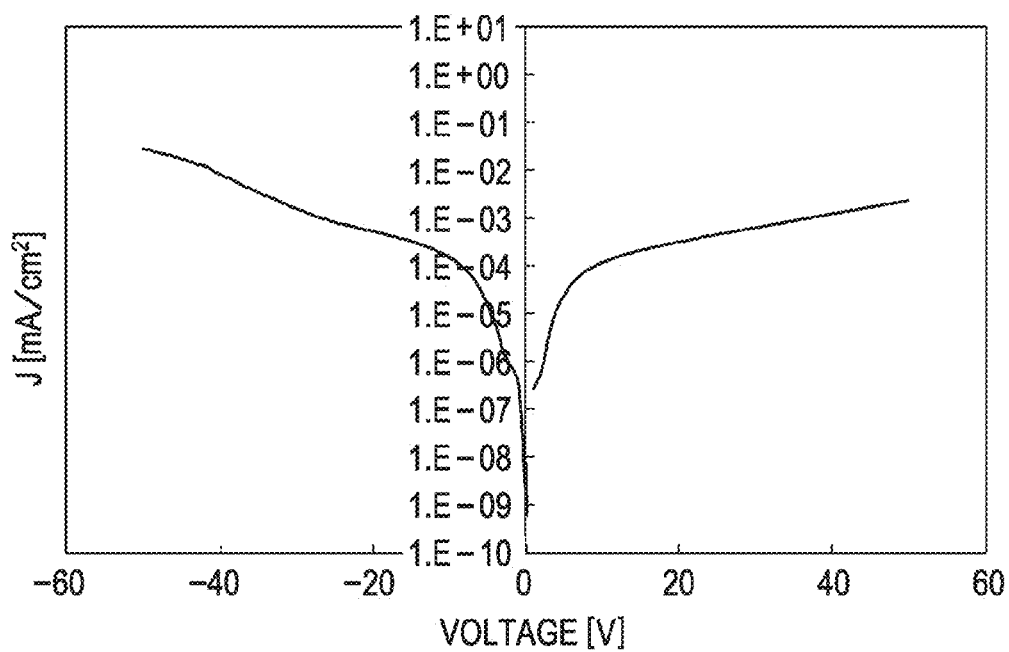

The voltage up to ±50V was applied to each piezoelectric element of Embodiment 1 and Comparative Example 1, and a relationship (an I-V curve) between the electric current density and the voltage was obtained. The result of Comparative Example 1 is shown in FIG. 13A and the result of Embodiment 1 is shown in FIG. 13B. As a result, Embodiment 1 having the buffer layer has a leak electric current value considerably lower than Comparative Example 1 not having the buffer layer, and pressure resistance thereof was greatly improved.

Reference Example 1

Firstly, a silicon oxide ($SiO_2$) film was formed on the surface of the (100) single crystal silicon (Si) substrate by the thermal oxidation. Next, titanium oxide of the thickness of 40 nm was laminated on the $SiO_2$ film, and the platinum film (the first electrode 60) of the thickness of 100 nm was formed thereon to face the (111) surface using the sputtering method.

Next, the piezoelectric film 70 was formed on the first electrode 60 using the spin coating method. The method is as below. Firstly, each n-oxtane solution of 2-ethyl hexanoic acid barium, 2-ethyl hexanoic acid titanium, 2-ethyl hexanoic acid copper, 2-ethyl hexanoic acid lithium, and 2-ethyl hexanoic acid boron was mixed at a predetermined ratio to manufacture the precursor solution.

Moreover, the precursor solution dropped on the substrate formed with the titanium oxide film and the platinum film, the substrate was rotated at 1500 rpm, and the piezoelectric body precursor film was formed (an application process). Next, the film was dried at 150° C. for one minute (a drying process). Next, the degreasing was performed at 350° C. for three minutes (a degreasing process). After repeatedly performing the process including the application process, the drying process and the degreasing process twice, the firing was performed in the oxygen atmosphere at 850° C. for five minutes by a RTA device (Rapid Thermal Annealing) (a firing process). Next, after repeating the application process, the drying process and the degreasing process twice, the process of performing the firing process of firing the film in a lump was repeated four times, and the piezoelectric film 70 of the total thickness of 800 nm was manufactured by the total eight application processes.

Next, a platinum film (the second electrode 80) of the thickness of 100 nm was formed as the second electrode 80 on the piezoelectric film 70 using the DC sputtering method, and the piezoelectric element 300 was formed which is formed of a piezoelectric material which is a barium titanate-based material, contains Ba and Ti of 1:1 (the mol ratio) and contains Cu of 1 mol % to Ti, Li of 1 mol % to Ti, and B of 1 mol % to Ti, specifically, the piezoelectric film 70 having a perovskite structure in $BaTiO_3$:Cu:Li:B=1:0.01:0.01:0.01 (the mol ratio).

Reference Example 2

The same operation as that of Reference Example 1 was performed except that the mixing ratios of 2-ethyl hexanoic acid barium, 2-ethyl hexanoic acid titanium, 2-ethyl hexanoic acid copper, 2-ethyl hexanoic acid lithium and 2-ethyl hexanoic acid boron of the precursor solution are changed, and the piezoelectric film 70 is formed of the complex oxide that is formed of the piezoelectric material which is the barium titanate-based material, contains Ba and Ti of 1:1 (the mol ratio), and contains Cu of 1 mol % to Ti, Li of 2 mol % to Ti, and B of 2 mol % to Ti.

Reference Example 3

The same operation as that of Reference Example 1 was performed except that the mixing ratios of 2-ethyl hexanoic acid barium, 2-ethyl hexanoic acid titanium, 2-ethyl hexanoic acid copper, 2-ethyl hexanoic acid lithium and 2-ethyl hexanoic acid boron of the precursor solution are changed, the piezoelectric film 70 is formed of the complex oxide that is formed of the piezoelectric material which is the barium titanate-based material, contains Ba and Ti of 1:1 (the mol ratio), and contains Cu of 1 mol % to Ti, Li of 3 mol % to Ti, and B of 3 mol % to Ti, and the firing condition using the RTA device in the firing process is 800° C. and five minutes.

Reference Example 4

The same operation as that of Reference Example 1 was performed except that the mixing ratios of 2-ethyl hexanoic acid barium, 2-ethyl hexanoic acid titanium, 2-ethyl hexanoic acid copper, 2-ethyl hexanoic acid lithium and 2-ethyl hexanoic acid boron of the precursor solution are changed, the piezoelectric film 70 is formed of the complex oxide that is formed of the piezoelectric material which is the barium titanate-based material, contains Ba and Ti of 1:1 (the mol ratio), and contains Cu of 1 mol % to Ti, Li of 5 mol % to Ti, and B of 5 mol % to Ti, and the firing condition using the RTA device in the firing process is 800° C. and five minutes.

Reference Example 5

The same operation as that of Reference Example 1 was performed except for using the precursor solution in which 2-ethyl hexanoic acid copper, 2-ethyl hexanoic acid lithium and 2-ethyl hexanoic acid boron are not mixed, and the piezoelectric element 300 was formed of the piezoelectric material which is the barium titanate-based material and contains Ba and Ti of 1:1 (the mol ratio), specifically, the piezoelectric film 70 having a perovskite structure in $BaTiO_3$.

Reference Example 6

The same operation as that of Reference Example 5 was performed except that the firing condition using the RTA device in the firing process is 950° C. and five minutes.

Test Example 5

In regard to the respective piezoelectric elements of Reference Examples 1 to 6, CuKα ray was used in an X-ray source using a "D8 Discover" made by Bruker AXS Inc., and the X-ray diffraction pattern of the piezoelectric film 70 was obtained at room temperature (25° C.). The result is shown in FIG. 14.

As a result, in all of Reference Examples 1 to 6, the peak due to the perovskite structure and the peak derived from the substrate were observed, and the peak derived from the heterogenous phase which is not the perovskite structure was not observed.

Test Example 6

Figure 15A:
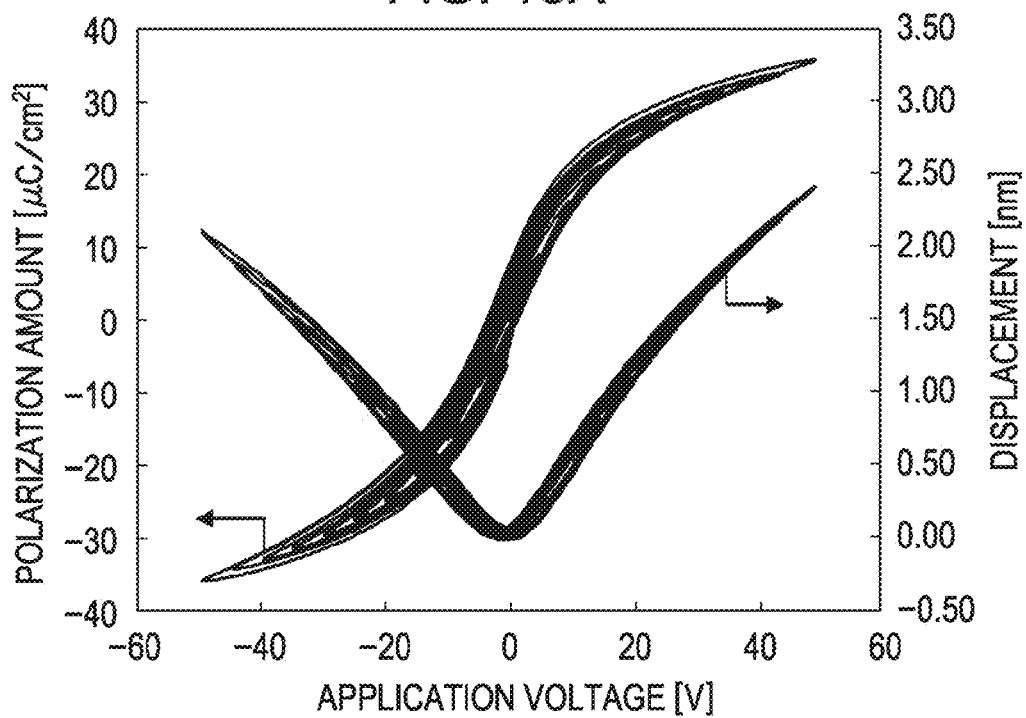
FIGS. 15A and 15B are diagrams that illustrate a P-V curve and an S-V curve of a reference example.
Figure 15B:
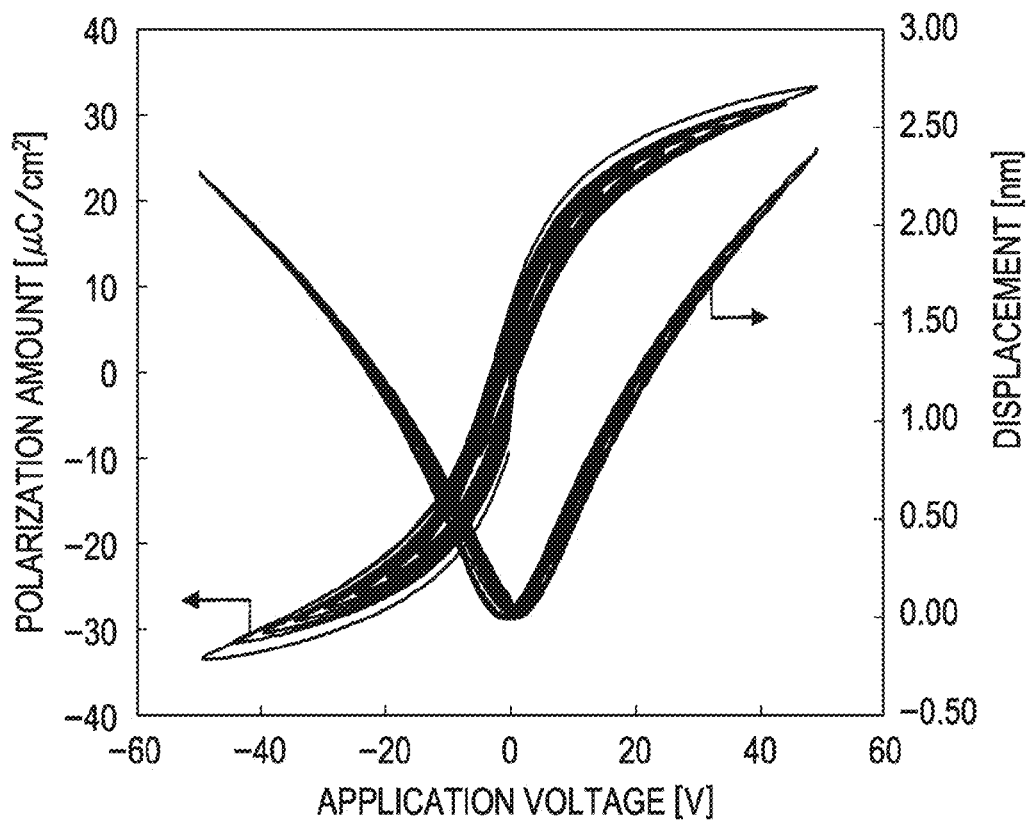

Chopping waves with a frequency of 1 kHz were applied to the respective piezoelectric elements of Reference Examples 1 to 6 at room temperature using the electrode pattern of φ=500 μm by an "FCE-1A" made by TOYO Corp., and a relationship of P (polarization quantity)-V (voltage) was obtained. As an example of the result, the result of Reference Example 6 is shown in FIG. 15A, and the result of Reference Example 3 is shown in FIG. 15B.

As a result, in Reference Examples 1 to 4, as in Reference Examples 5 and 6, there were satisfactory P-V hysteresis loop.

Test Example 7

Chopping waves with a frequency of 1 kHz was applied to the respective piezoelectric elements of Reference Examples 1 to 6 at room temperature using the electrode pattern of φ=500 μm by a displacement measurer (DBLI) made by AIXACCT Corp., and a relationship (a S-V curve) of S (an electric field induced strain (a displacement quantity))-V (voltage) was obtained. As an example of the result, the result of Reference Example 6 is shown in FIG. 15A, and the result of Reference Example 3 is shown in FIG. 15B. Moreover, a distortion factor (the displacement quantity of the piezoelectric film 70/the film thickness of the piezoelectric film 70) when applying the electric field 400 kV/cm was obtained from each S-V curve. The result thereof is shown in Table.

As a result, as shown in Table, in Reference Examples 1 and 2 containing Cu of 3 mol % or less to Ti, the distortion factor is considerably higher than Reference Examples 5 of the same predetermined condition. Furthermore, the higher the firing temperature is, the higher the distortion factor is. However, in Reference Examples 3 and 4 which contains of Cu of 3 mol % or less to Ti and has the firing temperature of 800° C., the distortion factor is equal to or greater than that of Reference Examples 3 and 4 having a firing temperature of 850° C. or 950° C.

Test Example 8

In Reference Examples 1 to 6, in regard to the piezoelectric film 70 in a state where the second electrode 80 is not formed, the cross-section just after forming was observed by a 50,000 times scanning electron microscope (SEM). A grain growth was evaluated when a case where the crystal grain greatly grows up is ○, a case where the crystal grain does not greatly grow up is Δ, and a case where almost none of the crystal grain grows up is x. Furthermore, compactness was evaluated when a case where the crystal grain is clogged up without a gap is ○, a case where there were some pores is Δ, and a case where there were many pores is x. The evaluation result is shown in Table. Furthermore, as an example of the result, the result of Reference Example 5 is shown in FIG. 16A, the result of Reference Example 6 is shown in FIG. 16B and the result of Reference Example 3 is shown in FIG. 16C.

Figure 16A:
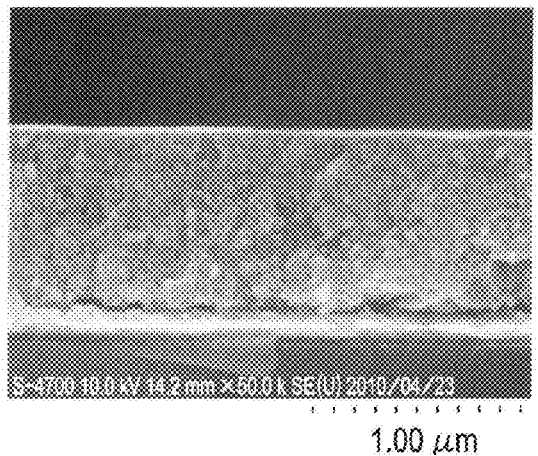
FIGS. 16A to 16C are diagrams that observe a cross-section of a piezoelectric film of a reference example.
Figure 16B:
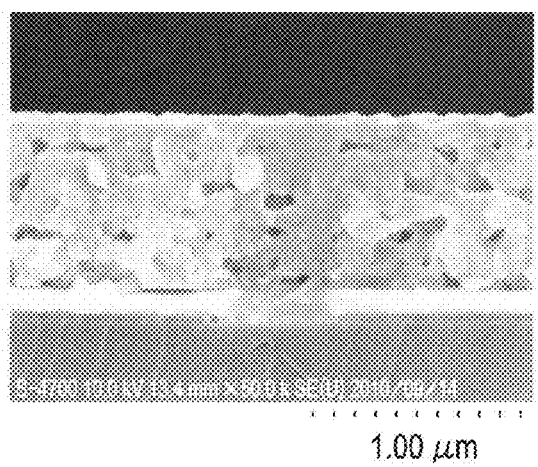
Figure 16C:
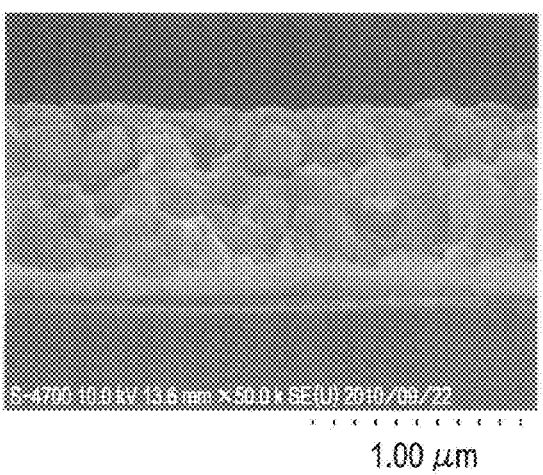

As a result, as shown in Table and FIGS. 16A to 16C, in Reference Examples 2 to 4 containing Cu of 3 mol % or less to Ti, Li of 2 to 5 mol % and B of 2 to 5 mol % to Ti, though the firing time in the RTA device is short, and the firing temperature is low 800 to 850° C., the grain of the crystal was great and compact. Meanwhile, in Reference Examples 5 and 6 that do not contain Cu, Li and B and Reference Example 1 having low contents of Li and B, the crystal is small and the gap is opened compared to Reference Examples 2 to 4. Furthermore, in Reference Examples 2 to 4, the crack was not also generated, but in Reference Example 1, the crack was generated. In Reference Examples 2 to 4, since the grow-up of the crystal grain was promoted, it is supposed that the occurrence of the crack was suppressed.

TABLE

| | mol % of Cu to Ti | mol % of Li to Ti | mol % of B to Ti | Firing condition of RTA | Grain grow-up | com-pact-ness | Distor-tion rate (%) |
|---|---|---|---|---|---|---|---|
| Reference Example 5 | 0 | 0 | 0 | 850° C. 5 min | x | x | 0.12 |
| Reference Example 6 | 0 | 0 | 0 | 950° C. 5 min | Δ | Δ | 0.20 |
| Reference Example 1 | 1 | 1 | 1 | 850° C. 5 min | Δ | x | 0.19 |
| Reference Example 2 | 1 | 2 | 2 | 850° C. 5 min | ○ | ○ | 0.21 |
| Reference Example 3 | 1 | 3 | 3 | 800° C. 5 min | ○ | ○ | 0.24 |
| Reference Example 4 | 1 | 5 | 5 | 800° C. 5 min | ○ | ○ | 0.13 |

Reference Example 7

Firstly, a silicon oxide (SiO$_2$) film was formed on the surface of the (100) single crystal silicon (Si) substrate by the thermal oxidation. Next, titanium oxide of the thickness of 40 nm was laminated on the SiO$_2$ film, and the platinum film (the first electrode 60) of the thickness of 100 nm was formed thereon to face the (111) surface using the sputtering method.

Next, the piezoelectric film 70 was formed on the first electrode 60 using the spin coating method. The method is as below. Firstly, each n-oxtane solution of 2-ethyl hexanoic acid barium, 2-ethyl hexanoic acid titanium, 2-ethyl hexanoic acid copper, 2-ethyl hexanoic acid lithium, and 2-ethyl hexanoic acid boron was mixed at a predetermined ratio to prepare the precursor solution.

Moreover, the precursor solution dropped on the substrate formed with the titanium oxide film and the platinum film, the substrate was rotated at 1500 rpm, and the piezoelectric body precursor film was formed (an application process). Next, the film was dried at 150° C. for one minute (a drying process). Next, the degreasing was performed at 350° C. for three minutes (a degreasing process). Next, the firing was performed in the oxygen atmosphere at 800° C. for five minutes by a RTA device (a firing process). Next, a series of operations including the application process, the drying process, the degreasing process and the firing process were repeated 14 times, and the piezoelectric film 70 with a total thickness of 1400 nm was manufactured by the total of 14 application processes.

Next, a platinum film (the second electrode 80) of the thickness of 100 nm was formed as the second electrode 80 on the piezoelectric film 70 using the DC sputtering method, and the piezoelectric element 300 was formed which is formed of a piezoelectric material which is a barium titanate-based material, contains Ba and Ti of 1:1 (the mol ratio) and contains Cu of 1 mol % to Ti, Li of 3 mol % to Ti, and B of 3 mol % to Ti, specifically, the piezoelectric film 70 having a perovskite structure in BaTiO$_3$:Cu:Li:B=1:0.01:0.03:0.03 (the mol ratio).

Reference Example 8

The same operation as that of Reference Example 7 was performed except that a series of operations including the application process, the drying process, the degreasing process and the firing process is not performed, the process including the application process, the drying process and the degreasing process is repeatedly performed twice, then the firing is performed at 800° C. for five minutes using the RTA device in the oxygen atmosphere, and after repeating the application process, the drying process and the degreasing process twice, the process of firing process of firing in a lump is repeated seven times, and the piezoelectric film 70 is formed by total 14 application processes.

Test Example 9

In regard to the respective piezoelectric elements of Reference Examples 7 and 8, CuKα ray was used in an X-ray source using a "D8 Discover" made by Bruker AXS GmBH., and the X-ray diffraction pattern of the piezoelectric film 70 was obtained at room temperature (25° C.). The result is shown in FIG. 17. As a result, in Reference Examples 7 and 8, the peak due to the perovskite structure and the peak derived from the substrate were also observed. Furthermore, the peak derived from the heterogenous phase which is not the perovskite structure was not observed.

Test Example 10

Figure 18A:
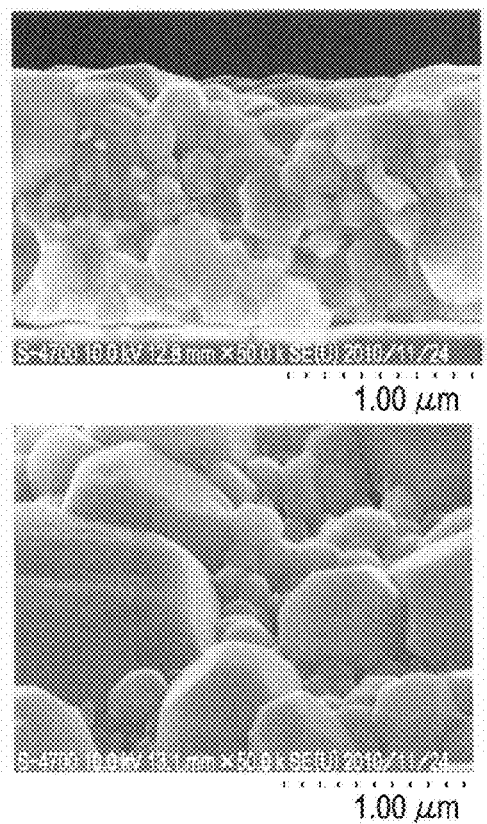
FIGS. 18A and 18B are photographs that observe a cross-section and a surface of the piezoelectric film of a reference example.
Figure 18B:
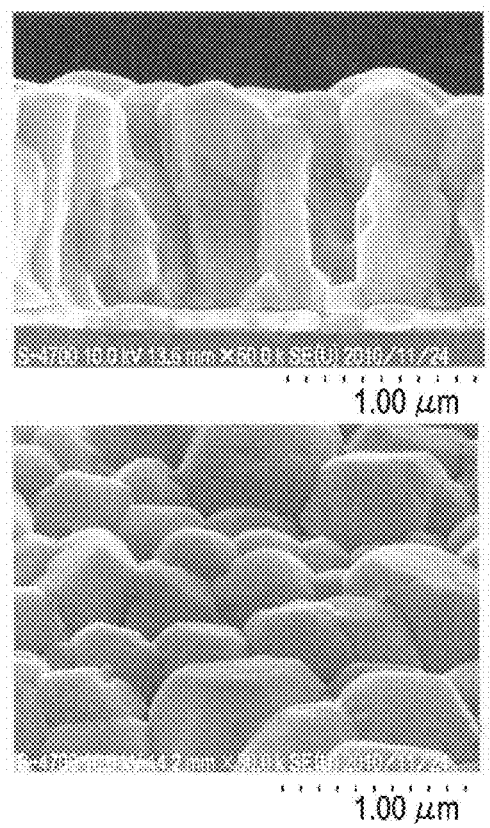

In Reference Examples 7 and 8, in regard to the piezoelectric film 70 in a state where the second electrode 80 is not formed, the surface and the cross-section just after forming was observed by a 50,000 times scanning electron microscope (SEM). As an example of the result, the result of Reference Example 8 is shown in FIG. 18A, and the result of Reference Example 7 is shown in FIG. 18B. In addition, the upper end of FIGS. 18A and 18B is a cross-sectional photograph, and the lower end thereof is a surface photograph.

As a result, as shown in FIGS. 18A and 18B, in Reference Example 7 which was fired for each layer, a columnar crystal was formed and the crystal grain diameter is also uniform. Meanwhile, in Reference Example 8 in which two layers were fired in a lump, the granular crystal rather than the columnar shape was obtained, and the crystal grain diameter is also non-uniform compared to Reference Example 7.

Test Example 11

Chopping waves with a frequency of 1 kHz were applied to the respective piezoelectric elements of Reference Examples 7 and 8 at room temperature using the electrode pattern of φ=500 μm by an "FCE-1A" made by TOYO Corp., and a relationship of P (polarization quantity)-V (voltage) was obtained. As a result, in Reference Examples 7 and 8, there were satisfactory hysteresis curves.

Test Example 12

Chopping waves with a frequency of 1 kHz was applied to the respective piezoelectric elements of Reference Examples 7 and 8 at room temperature using the electrode pattern of φ=500 μm using a displacement measurer (DBLI) made by AIXACCT Corp., and a relationship (a S-V curve) of S (an electric field induced strain (a displacement quantity)) and V (voltage) was obtained. As a result, in Reference Examples 7 and 8, the distortion factor was high.

Furthermore, a relationship between a maximum polarization amount (written by $P_{max}$ in FIGS. 19A and 19B) to the positive application voltage and the displacement amount was found from the results of Test Examples 11 and 12. The result of Reference Example 8 is shown in FIG. 19A, and the result of Reference Example 7 is shown in FIG. 19B.

Figure 19A:
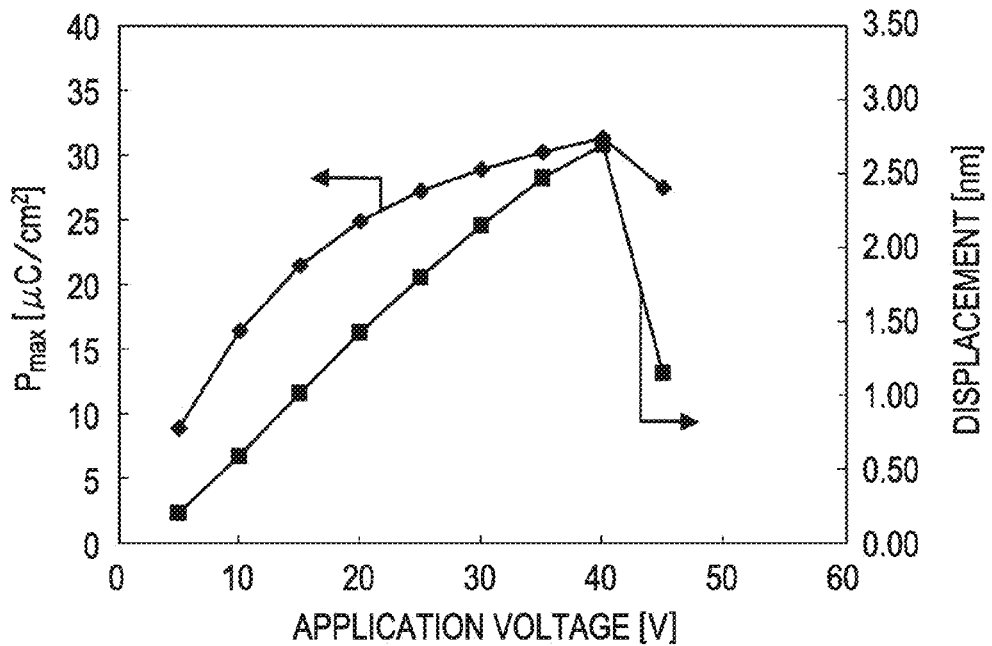
FIGS. 19A and 19B are diagrams that illustrate a relationship between a maximum polarization quantity to a positive application voltage and a displacement quantity.
Figure 19B:
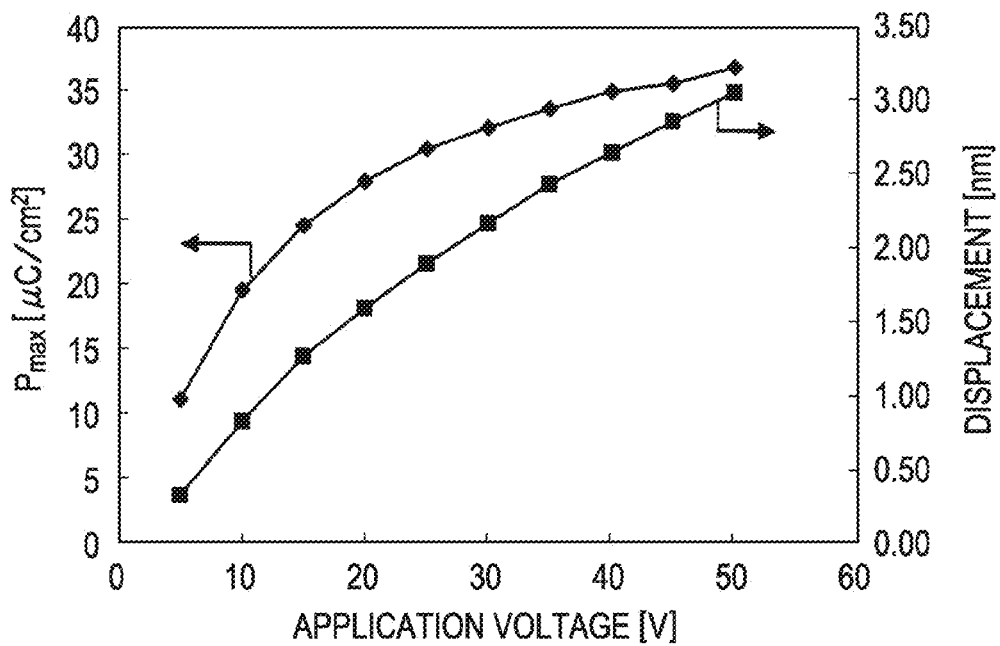

As a result, as shown in FIGS. 19A and 19B, in Reference Example 7 in which each layer is fired, it was found that even if the voltage is applied up to about 50 V, the piezoelectric element is not destroyed and the pressure resistance is superior. Meanwhile, in Reference Example 8 in which two layers are fired in a lump, it was found that if the voltage exceeds approximately 40 V, the maximum polarization amount and the displacement amount rapidly drop, and the pressure resistance is inferior to Reference Example 7.

From Reference Examples mentioned above, it is understood that the piezoelectric film has a high strain amount, is compact, and can be fired at a low temperature by forming the piezoelectric film from the barium titanate-based complex oxide that has the perovskite structure containing barium, titanium, copper of 3 mol % or less to titanium, lithium of 2 mol % or more and 5 mol % or less to titanium, and boron of 2 mol % or more and 5 mol % or less to titanium. Furthermore, it is also understood that the pressure tightness is satisfactory by forming the piezoelectric film having a columnar crystal. Thus, even in the invention provided with the buffer layer that is formed of the complex oxide having a perovskite structure containing bismuth, iron, manganese, barium and titanium on the surface of at least one side of the piezoelectric film, it is possible to similarly infer that the piezoelectric film has a high strain quantity, is compact, and can be fired at a low temperature. Furthermore, by forming the piezoelectric film having a columnar crystal, it is possible to infer that pressure tightness is satisfactory.

Other Embodiments

As mentioned above, although an embodiment of the invention has been described, the basic configuration of the invention is not limited thereto. For example, in the embodiment mentioned above, although the silicon single crystalline substrate was described as the flow path forming substrate 10, the invention is not particularly limited thereto, and, for example, a material such as a SOI substrate and a glass may be used.

In addition, in the embodiment mentioned above, although the piezoelectric element 300 was described as an example in which the first electrode 60, the piezoelectric film 70 and the second electrode 80 are laminated on the substrate (the flow path forming substrate 10), the invention is not particularly limited thereto, and for example, the invention can also be applied to a longitudinal vibration type piezoelectric element in which the piezoelectric material and the electrode forming material are alternately laminated each other and are axially expanded and contracted.

Figure 20:
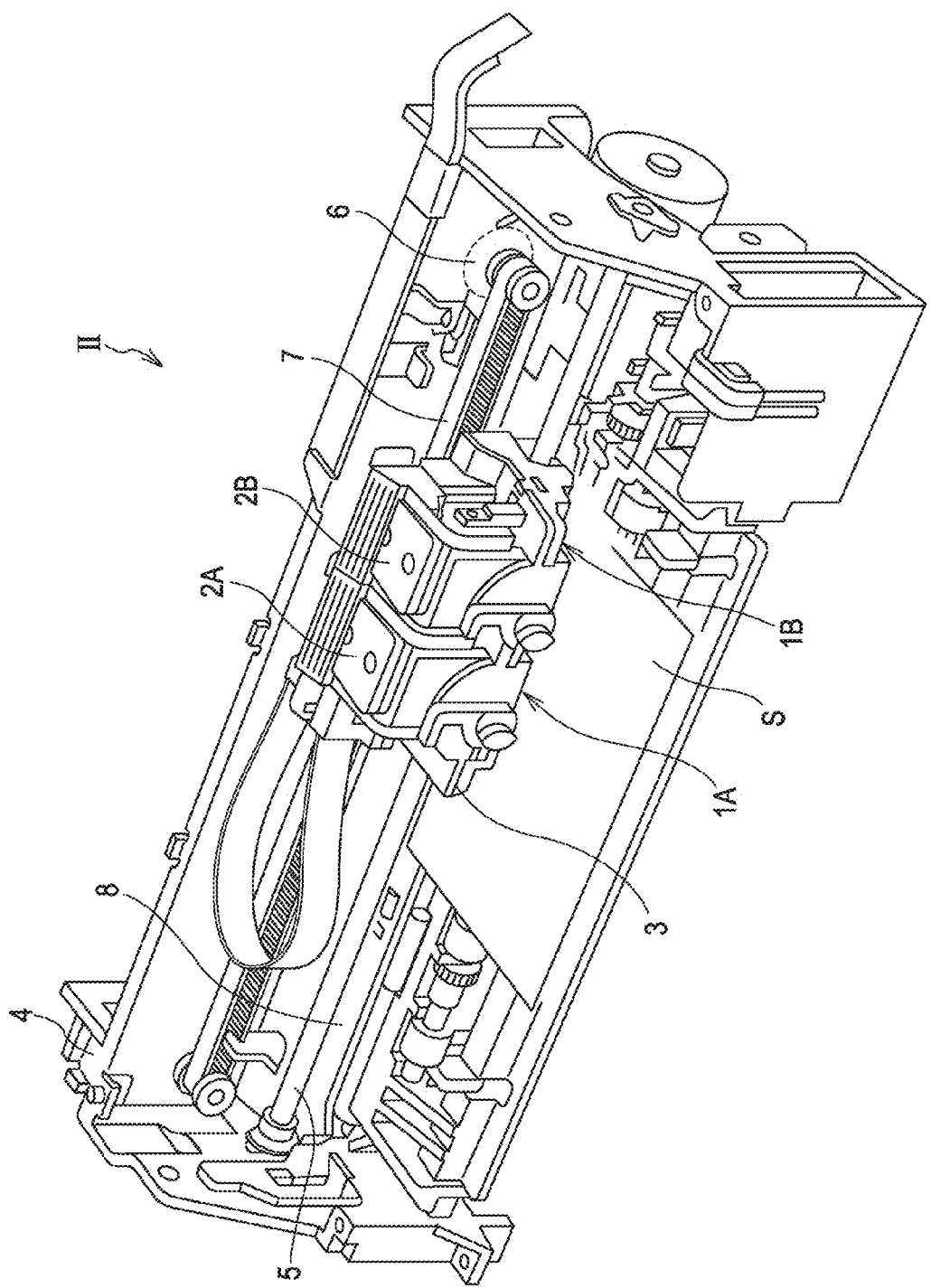
FIG. 20 is a diagram that illustrates a schematic configuration of a recording device according to an embodiment of the invention.

Furthermore, the ink jet type recording head of the embodiments constitutes a part of the recording head unit including the ink flow path communicating with the ink cartridge or the like, and is mounted on the ink jet type recording device. FIG. 20 is a schematic view that illustrates an example of the ink jet type recording device.

In an ink jet type recording device II shown in FIG. 20, recording head units 1A and 1B having an ink jet type recording head I is provided with cartridges 2A and 2B constituting ink supplying means in an attachable and detachable manner, and a carriage 3 equipped with the recording head units 1A and 1B is provided in a carriage shaft 5 attached to a device main body 4 in an axially freely movable manner. The recording head units 1A and 1B, for example, each discharge a black ink composition and a color ink composition.

Moreover, the drive force of the drive motor 6 is transmitted to the carriage 3 via a plurality of gear wheels (not shown) and a timing belt 7, whereby the carriage 3 equipped with the recording head units 1A and 1B are moved along the carriage shaft 5. Meanwhile, the device main body 4 is provided with a platen 8 along the carriage shaft 5, and a recording sheet S serving as a recording medium such as a paper fed by a paper feeding roller (not shown) or the like is wrapped around the platen 8 and is transported.

In addition, in the embodiments mentioned above, although the ink jet type recording head was described as an example of the liquid ejecting head, the invention is widely intended for the overall liquid ejecting head, and can of course be applied to a liquid ejecting head that ejects liquid other than ink. As other liquid ejecting head, for example, there are various recording heads used for an image recording device such as a printer, a color material ejecting head used for manufacturing a color filter such as a liquid crystal display, an organic EL display, an electrode material ejecting head used for forming an FED (field emission display) electrode or the like, a living body organic matter ejecting head used for manufacturing a bio chip or the like.

Furthermore, the piezoelectric element according to the invention is not limited to the piezoelectric element used in the liquid ejecting head but can also be used in other devices. As other devices, there are an ultrasonic device such as an ultrasonic transmitter, an ultrasonic motor, a temperature-electricity converter, a pressure-electricity converter, a ferroelectric transistor, a piezoelectric transformer, an interception filter of harmful rays such as infrared rays, an optical filter using a photonic crystal effect using a quantum dot formation, a filter such as an optical filter using an optical interference of a thin film or the like. Furthermore, it is also possible to apply the invention to the piezoelectric element used as the sensor and the piezoelectric element used as a ferroelectric memory. As the sensor using the piezoelectric element, for example, there is an infrared sensor, an ultrasonic sound sensor, a heat-sensitive sensor, a pressure sensor, a pyroelectric sensor, a gyro sensor (an angular velocity sensor) or the like.

What is claimed is:

1. A liquid ejecting head that ejects liquid from nozzle openings comprising:
    a piezoelectric film with buffer layer on its surface; and
    a piezoelectric element including the piezoelectric film inserted between electrodes,
    wherein the piezoelectric film is made from barium titanate-based composition having a perovskite structure containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount, wherein the buffer layer is formed from a complex oxide with perovskite structure containing bismuth, iron, manganese, barium and titanium.

2. The liquid ejecting head according to claim 1, wherein the buffer layer is provided on both surfaces of barium titanate-based piezoelectric film.

3. The liquid ejecting head according to claim 1, wherein the piezoelectric film is comprised of columnar crystals.

4. A liquid ejecting apparatus comprising the liquid ejecting head according to claim 1.

5. A liquid ejecting apparatus comprising the liquid ejecting head according to claim 2.

6. A liquid ejecting apparatus comprising the liquid ejecting head according to claim 3.

7. A piezoelectric element comprising a piezoelectric film inserted between electrodes with a buffer layer on one or two surfaces of the piezoelectric film, wherein the piezoelectric film is made from barium titanate-based composition having a perovskite structure containing barium titanate-based composition having a perovskite structure containing barium, titanium as well as copper equal to or less than 3 mol % of titanium amount, lithium more than or equal to 2 mol % and less than or equal to 5 mol % of titanium amount, and boron more than or equal to 2 mol % and less than or equal to 5 mol % of titanium amount and the buffer layer is formed from a complex oxide with perovskite structure containing bismuth, iron, manganese, barium and titanium.

* * * * *